(12) United States Patent
Le et al.

(10) Patent No.: US 11,416,664 B2
(45) Date of Patent: Aug. 16, 2022

(54) AI-DRIVEN SELF ADAPTING MICROELECTRONIC CIRCUITS

(71) Applicant: ANALOG INTELLIGENT DESIGN, INC., Morgan Hill, CA (US)

(72) Inventors: Khanh M Le, Morgan Hill, CA (US); Koushik De, Hyderabad (IN); Deepthi Amuru, Hyderabad (IN); Zia Abbas, Hyderabad (IN)

(73) Assignee: Analog Intelligent Design, Inc., Morgan Hill, CA (US)

( * ) Notice: Subject to any disclaimer, the term of this patent is extended or adjusted under 35 U.S.C. 154(b) by 0 days.

(21) Appl. No.: 17/088,475

(22) Filed: Nov. 3, 2020

(65) Prior Publication Data
US 2021/0182466 A1 Jun. 17, 2021

Related U.S. Application Data

(60) Provisional application No. 62/974,634, filed on Dec. 16, 2019.

(51) Int. Cl.
*G06F 30/367* (2020.01)
*G06N 3/08* (2006.01)

(52) U.S. Cl.
CPC ............. *G06F 30/367* (2020.01); *G06N 3/08* (2013.01)

(58) Field of Classification Search
CPC .................................. G06N 3/08; G06F 30/367
See application file for complete search history.

(56) References Cited

PUBLICATIONS

Herbert, S., & Marculescu, D. (Feb. 2009). Variation-aware dynamic voltage/frequency scaling. In 2009 IEEE 15th International Symposium on High Performance Computer Architecture (pp. 301-312). IEEE. (Year: 2009).*
Zhang, K., Guliani, A., Ogrenci-Memik, S., Memik, G., Yoshii, K., Sankaran, R., & Beckman, P. (2017). Machine learning-based temperature prediction for runtime thermal management across system components. IEEE Transactions on parallel and distributed systems, 29(2), 405-419. (Year: 2017).*

(Continued)

*Primary Examiner* — Bijan Mapar
(74) *Attorney, Agent, or Firm* — Main Law Cafe; Richard Brewster Main

(57) ABSTRACT

The present description relates to a method based on artificial intelligence to implement a wide range of microelectronic circuits that can adapt by themselves to the usage conditions (e.g. loading changes), manufacturing variances or defects (e.g. process variations, device parameter mismatches, device model inaccuracies or changes, etc.), as well as environmental conditions (e.g. voltage, temperature, interference) in order to negate all or part of their effects on the circuit performance characteristics and achieve a very tight set of specifications over the wide range of conditions. Each microelectronic circuit is represented by a neural network model whose behavior is a function of the actual input signals, the usage and environmental conditions. An attached AI engine will infer from the model, the input signals, the usage conditions and the environmental conditions and create the adaptive changes required to modify the microelectronic circuit's behavior to negate all or part of their effects on the circuit performance characteristics and to achieve a very tight set of specifications.

2 Claims, 23 Drawing Sheets

(56) References Cited

PUBLICATIONS

Moeng, M., & Melhem, R. (May 2010). Applying statistical machine learning to multicore voltage & frequency scaling. In Proceedings of the 7th ACM international conference on Computing frontiers (pp. 277-286). (Year: 2010).*

Gil, L. (Nov. 7, 2018). Efficient modeling and computation methods for robust AMS system design. (Year: 2018).*

Martin Andraud, Marian Verhelst; KU Leuven, Dept. of Electrical Engineering (ESAT), MICAS group, Belgium; From on-chip self-healing to self-adaptivity in analog/RF ICs: challenges and opportunities; IEEE Conference Paper—Jul. 2018.

Kiruba Sankaran Subramani University of Texas at Dallas, Angelos Antonopoulos University of Texas at Dallas, and Yiorgos Makris University of Texas at Dallas; On-die learning-based self-calibration of analog/RF ICs; IEEE Conference Paper—Apr. 2016.

\* cited by examiner

| Specs Table | Min | Typ | Max |
|---|---|---|---|
| Iπ (μA) | 8 | 10 | 13 |
| Accuracy (ppm) | 8.133 | 10.25 | 221.7 |
| Line sensitivity (%/V) | 0.06 | 0.07 | 0.16 |
| PSRR (dB) | -68 | -91 | -93 |
| Power (μW) | 18.82 | 54.2 | 140.2 |
FIG. 12
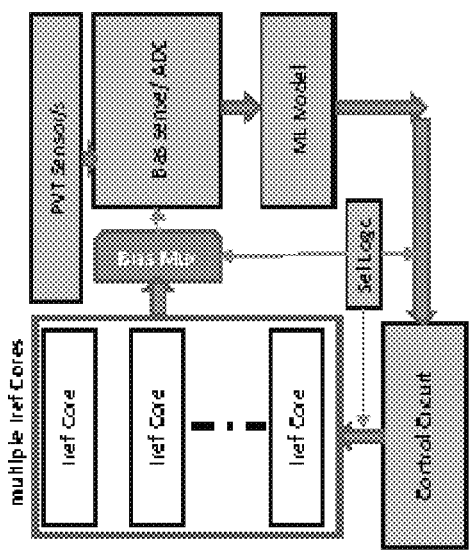
FIG. 13
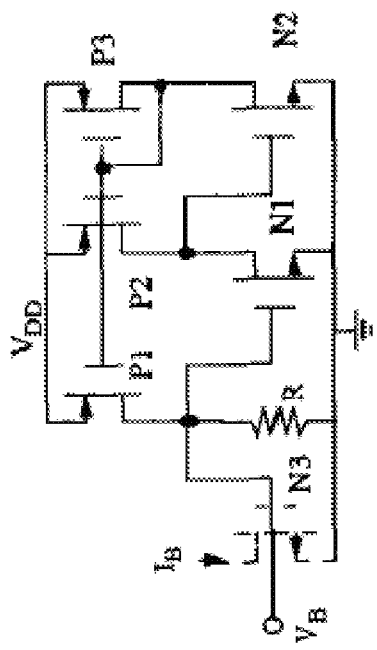
FIG. 11

| Training data set: 41393 samples, 10% split for training and test data sets | | | |
|---|---|---|---|
| Iref | Actual from Simulations | ML model Predicted | Error % |
| Mean | 8.7972e-06 | 8.78869e-06 | -0.102078 |
| Std Dev | 5.73834e-11 | 5.67785e-11 | 0.528425 |
| Variance | 7.57518e-06 | 7.53515e-06 | 1.05406 |
| Computation time = 1.68173 secs | | | |

FIG. 17

| Process codes | | | | LGBM | | | |
|---|---|---|---|---|---|---|---|
| pvdd | temp | f1 | f2 | Delta | Resistance | Delta from reference | Code |
| 000101111 | 101010101 | 010000111 | 010000110 | 9.32E-06 | 53610 | 9.34E-06 | 101100 |
| 000101111 | 011101011 | 001110011 | 001111011 | 8.91E-06 | 55730 | 8.93E-06 | 100011 |
| 000000000 | 100011101 | 000001110 | 000001110 | 9.01E-06 | 55260 | 9.02E-06 | 100101 |
| 010100010 | 001110011 | 100101110 | 100011000 | 9.13E-06 | 54790 | 9.11E-06 | 100111 |
| 110100110 | 010001100 | 110110110 | 110111011 | 9.44E-06 | 53130 | 9.44E-06 | 101110 |

VS Codes → TS Codes → PMON Codes → → Codes for control register

| Specs Table (Self-adaptive) | Min | Typ | Max | Comments |
|---|---|---|---|---|
| $I_{ref}$ (uA) | 9.8 | 10 | 10.1 | Improved spread |
| Accuracy (ppm) | 10.1 | 10.25 | 10.4 | Enhanced accuracy |
| Line sensitivity (%/V) | 0.01 | 0.01 | 0.01 | Improved line sensitivity |
| PSRR (dB) | -90 | -91 | -91 | Better PSRR |
| Power (uW) | 54 | 55 | 55 | Typ power alignment |

FIG. 31

|  | V | T | Iref (uA) | Target (Nominal) | %Diff |
|---|---|---|---|---|---|
| Before self-adaptation |  |  | 13 |  | 30% |
|  | 0.88 | 125 |  | 10 |  |
| After self-adaptation |  |  | 10.1 |  | <1% |

FIG. 32

|  | V | T | Iref (uA) | Target (Nominal) | %Diff |
|---|---|---|---|---|---|
| Before self-adaptation |  |  | 8 |  | -20% |
|  | 0.72 | -40 |  | 10 |  |
| After self-adaptation |  |  | 9.8 |  | <2% |

FIG. 33

AI-DRIVEN SELF ADAPTING MICROELECTRONIC CIRCUITS

BACKGROUND

Field of the Invention

The present invention relates to a method based on artificial intelligence to implement a wide range of microelectronic circuits that can adapt by themselves to the usage conditions (e.g. loading changes), manufacturing variances or defects (e.g. process variations, device parameter mismatches, device model inaccuracies or changes, etc.) as well as environmental conditions (e.g. voltage, temperature) in order to negate all or part of their effects on the performance characteristics circuit block. In accordance with the present description, a machine learning model is used to represent the behavior of the microelectronic circuits in response to changes in the conditions on their operation. Built from machine learning data derived from simulation, the machine learning model will infer appropriate internal changes to the circuit components, e.g. sizes, functionality, connections, etc., in order to negate all or part of the effects on the circuit performance characteristics caused by the changes in conditions. The microelectronics circuits implemented according to this description include additional hardware like process, voltage and temperature sensors to monitor the environmental conditions as well as control circuits to execute the change commands provided by the machine learning model.

Description of Related Art

This method is superior to prior and current state of the art methodologies that rely on fixed, unchangeable combination of circuits and components that must be designed to meet the design specs over all the worst cases of the set of usage or environmental conditions. Such "design-for-worse-case" methodology has been ongoing for decades, creating unnecessarily larger, hotter, more complex, less optimal microelectronic circuits that fail as soon as they encounter conditions outside of the specified ranges. The wasted area, power and performance is also unnecessary since most circuits operate in or near nominal environmental conditions.

BRIEF SUMMARY

The present description relates to a method based on artificial intelligence to implement a wide range of microelectronic circuits that can adapt by themselves to the usage conditions (e.g. loading changes), manufacturing variances or defects (e.g. process variations, device parameter mismatches, device model inaccuracies or changes, etc.) as well as environmental conditions (e.g. voltage, temperature) in order to negate all or part of their effects on the circuit performance characteristics and achieve a very tight set of specifications over the wide range of conditions. In the present description, "microelectronics circuit" and "circuit" are used interchangeably.

At the hardware level, the system includes:
1. The microelectronic circuit being designed includes a "functional section" that receives the actual electrical input signals and generates the appropriate output signals as intended. It also includes an additional "adaptation section" that, based on the status of the Change Control Register, will be exercised to realize the appropriate changes to the "functional section".
2. A Change Control Register storing the various commands instructing the microelectronic circuits to make the appropriate changes to its functions,
3. An AI engine that, based on the usage and environmental conditions, would infer the necessary changes to the microelectronic circuit to restore its specified functionality or characteristics,
4. An environment monitor to monitor the environmental (Voltage, Temperature) or physical conditions (process shifts, mismatches, defects, etc.), and
5. A usage monitor to monitor the usage conditions (loading changes, interference, distortion, etc.).

The hardware of the above AI engine includes a CPU to perform all the calculation tasks and memories to store a representation of the machine learning model representing the microelectronic circuit. In some simple implementations, the machine learning model is created locally with the CPU which also performs the inferencing and all other computational tasks. In such cases, machine learning data is stored in local memory. In most implementations where there is a large amount of machine learning data used for training, the machine learning model is created with a remote set of CPUs and data stored in the cloud. The computational tasks are also performed in the cloud.

Since these additional circuitries take up some area, they can be applied to several microelectronic circuit blocks on the same chip to amortize the overall impact. Their additional power consumption can also be kept low by keeping them idle or in sleep mode until only when changes are required. In many implementations, there is already one or more CPUs available to perform other system functions. The self-adaptation function by the AI engine is just added to the main functions of the CPU.

With this methodology, the designer creates an AI-based representation or model of the microelectronic circuit. Such model represents the behavior of the microelectronic circuit according to the actual input signals, the usage and environmental conditions. It also includes some representations of the changes and variations of the actual functions, parameters, internal circuits of the microelectronic circuits that, based on the inference results, will be activated to respond to the updated usage or environmental conditions in order to bring the microelectronic circuit back to its original specifications or intended functionality.

By extension, the microelectronic circuit can learn from the usage and environmental conditions and change itself internally to produce certain new functionality or change its previous functionality to a certain new one as specified by the inferencing engine.

With this methodology, the designer would acquire via simulations all the necessary machine learning data that characterizes the functionality and behavior of the microelectronic circuits under the various operating and environmental conditions specified.

With this methodology, the designer would create representations (or models) of the input signals and the usage and environmental conditions.

At the hardware level, the design of the microelectronic circuits involves the implementation of the desired circuit function ("functional section") as well as that of the additional circuits or functions ("adaptation section") required to bring its operation or characteristics back to the original specifications. This is where a fundamental methodology change occurs. In the current and prior art, the designer must come up with various complex circuits or design tricks that ensure functionality over a wide spectrum of usage and environmental conditions. His focus is on extensively simulate the circuits and verify that they work. This methodology increases the complexity, area, power, and the risk of failure of the circuits due to unforeseen behavior, inadequate simulation coverage, etc. With the current methodology, the base circuit design is simpler but is capable of changing itself to negate all or part of the effects on its performance characteristics caused by changes in the usage and environmental conditions and achieve a very tight set of specifications over the wide range of conditions.

With the new methodology in this description, the designer creates the base circuit then focuses on the circuit changes to be activated under the various usage and environmental conditions. Such circuit changes can range from simple device size changes, additional gates, data bits, or even additional functions like amplifier stages, current sources, etc. Meanwhile, the "base" circuit can be very simple. The complexity of the design changes from that of the base circuit to that of add-on adaptation circuits that realize the desired changes to the base circuit. To simplify the task, libraries of add-ons or libraries of adaptable base circuits can be created.

With the new methodology, the focus of the simulations shifts from ensuring that the complex microelectronic circuit functions and meets all the required specs over the wide range of conditions to the simulations of all the modified versions of the base circuit to generate the right data to train the machine learning model that will infer the appropriate changes to the circuit.

It is an advantage of this description to be able to produce microelectronic circuits that can change themselves according to the usage or environmental conditions to negate all or part of their effects on the circuit performance characteristics or maintain their originally specified functionality.

It is another advantage of this description to be able to produce microelectronic circuits that can learn from the usage and environmental conditions and change themselves to provide certain new functionality or characteristics.

It is yet another advantage of this description is the achievement of much tighter specifications of the circuits over the environmental and usage conditions compared to the current methodology, increasing overall performance of the circuit and the system using it.

It is yet another advantage of this description to describe a new design methodology of microelectronic circuits based on machine learning and artificial intelligence to produce circuits that can adapt themselves to usage and environmental conditions to conditions to negate all or part of their effects on the circuit performance characteristics and achieve a very tight set of specifications over the wide range of conditions.

It is yet another advantage of this description to describe a new design methodology of microelectronic circuits based on machine learning and artificial intelligence to produce circuits that can adapt themselves to usage and environmental conditions to implement new or modified functionality, or specifications.

It is yet another advantage of this description to describe a new design methodology of microelectronic circuits based on neural network models of microelectronic circuits.

It is yet another advantage of this description to describe a new design methodology of microelectronic circuits based on machine learning models of electronics signals, usage and environmental conditions.

It is yet another advantage of this description to describe a new design methodology of microelectronic circuits based on an artificial intelligence engine, e.g. inferencing engine, that derives required changes to the microelectronic circuits from certain inputs It is another advantage of this description to expand the same design methodology to all types of complex functions (memories, graphic units, processor cores, etc.), sub-systems (graphics boards, FPGA boards, etc.), system on chip (SOC) devices, microprocessors, computers, networking equipment, etc.

BRIEF DESCRIPTION OF THE SEVERAL VIEWS OF THE DRAWINGS

All and other advantages of the present description will be readily appreciated as the same becomes better understood by reference to the following detailed description when considered in conjunction with the accompanying drawings herein.

FIG. 11 is a diagram of an example circuit, a current reference circuit.

FIG. 12 is a table showing specifications of the analog circuit of FIG. 11.

FIG. 13 is a diagram of a larger circuit that incorporates instances of the analog circuit of FIG. 11, together with shared AI/ML adaptation circuitry.

FIG. 17 is a table showing results of AUML adaptation of the circuit of FIG. 16.

FIG. 31 is a table showing performance metrics of the circuit of FIG. 16 with AI/ML adaptation.

FIG. 32 is a table showing performance metrics of the circuit of FIG. 16 under a set of conditions, with and without AUML adaptation.

FIG. 33 is a table showing performance metrics of the circuit of FIG. 16 under another set of conditions, with and without AI/ML adaptation.

DETAILED DESCRIPTION

Figure 1:
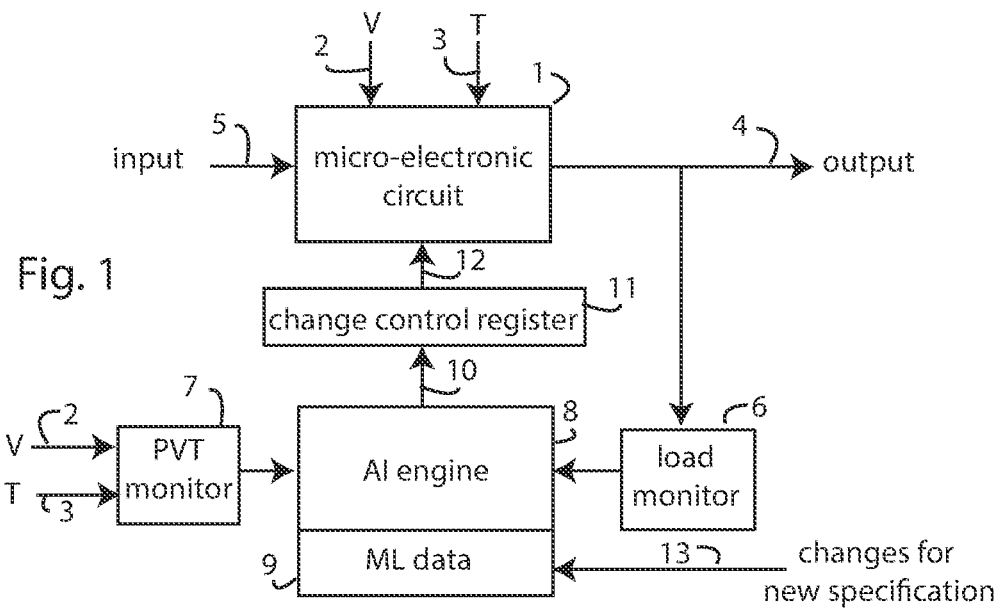
FIG. 1 describes the hardware implementation of the microelectronic circuit and the associated functions attached to it according to the methodology described herein.

In general, the present description is a method based on artificial intelligence to implement a wide range of microelectronic circuits that can adapt by themselves to the usage conditions (e.g. loading changes), manufacturing variances or defects (e.g. process variations, device parameter mismatches, device model inaccuracies or changes, etc.) as well as environmental conditions (e.g. voltage, temperature) in order to negate all or part of their effects on the circuit performance characteristics and achieve a very tight set of specifications over the wide range of conditions.

The system includes (see FIG. 1) a Microelectronic Circuit 1, a Load Monitor 6, a PVT monitor 7, an AI engine 8 with stored machine learning data 9 and a Change Control Register 11. In some implementations, the Load Monitor is not present.

The Microelectronic Circuit 1 is designed to function and provides certain outputs 4 within a certain range of the usage conditions (e.g. loading, interference, etc.), manufacturing variances (e.g. process variations, device parameter mismatches, etc.), and environmental conditions (e.g. voltage, temperature). Unlike implementations of prior art, the Microelectronic Circuit is accompanied by the other functions described below that help it adapt itself to negate all or part of the effects of the changes listed above and achieve a very tight set of specifications over the wide range of conditions.

During its operation, the Microelectronic Circuit 1 is subjected to environmental conditions like Voltage 2, Temperature 3 or manufacturing variances. The AI engine 8 monitors the changes in the output signals 4 through the Load Monitor 6. Such changes are fed into the AI engine 8. Changes in the Process, Voltage 2 and Temperature 3 are monitored by the PVT Monitor 7 which feeds into the AI Engine 8.

The AI Engine 8, based on the inputs it receives as described above and the stored ML Data 9, infers then generates the change commands required 10 to the Change Control Register 11 that stores that information 12 which is then forwarded to the Microelectronic Circuit (its "adaptation section") in order for it to realize the desired internal changes to negate all or part of the effects of the usage and environmental conditions on the circuit performance characteristics and achieve very tight specifications under any of the conditions encountered.

The above AI engine 8 includes, stored in its memory, a neural network model (types could be Convolution, Hopfield, Boltzmann, etc.) representing the microelectronic circuit and a CPU to perform the calculations. It should be noted that in the implementation shown, the machine learning model may be created and stored locally with the CPU. The CPU also performs the inferencing task. In such cases machine learning data is stored in local memory. In most implementations where the ML model is very complex and the amount of machine learning data used for training is very large, the machine learning model is created and stored by a remote set of CPUs from machine learning data stored in the cloud.

Figure 2:
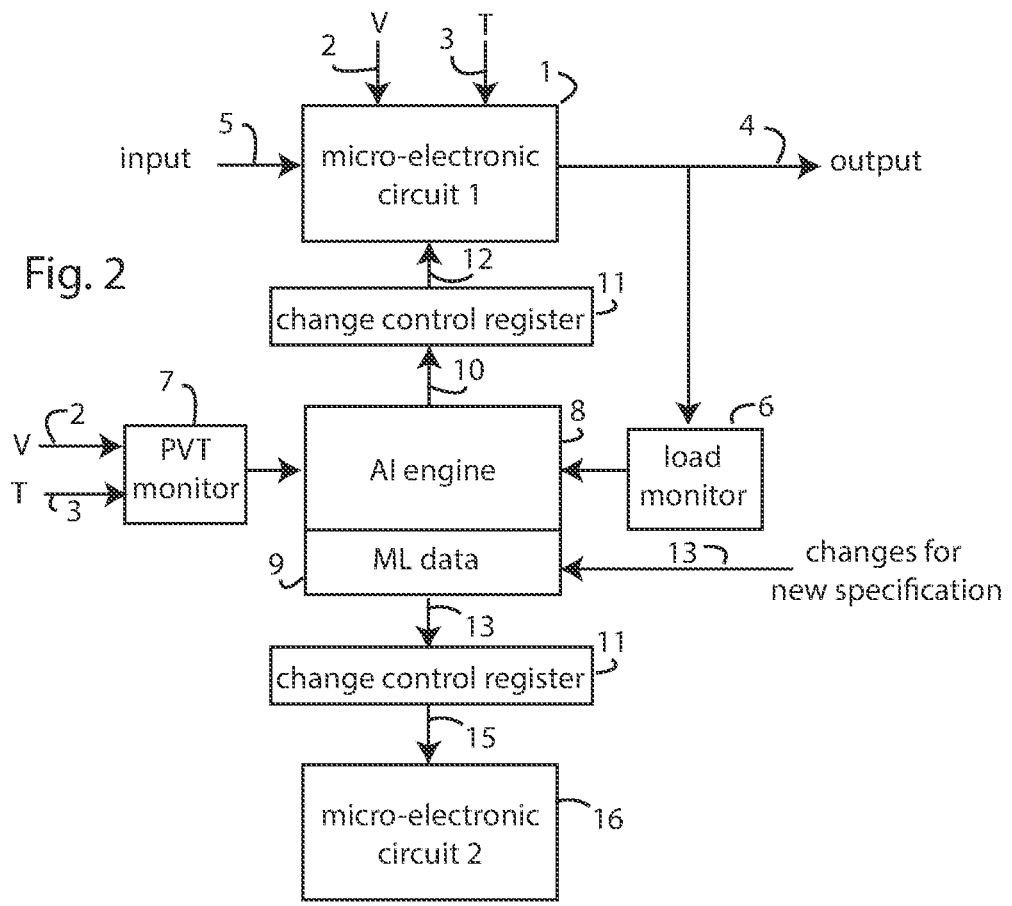
FIG. 2 shows a drawing of the system described in this description with the same AI engine controlling two separate microelectronic circuits. Of course, it can be extended to a larger number of microelectronic circuit blocks.

Since these additional circuitries take up some area, they can be applied to several microelectronic circuit blocks on the same chip to amortize the overall impact (See FIG. 2). Their additional power consumption can also be kept low by keeping them idle or in sleep mode until only when changes are required. In many cases the system already has a CPU with its memory. The AI/ML self-adaptation function are then just added to the workload of the CPU.

Figure 3:
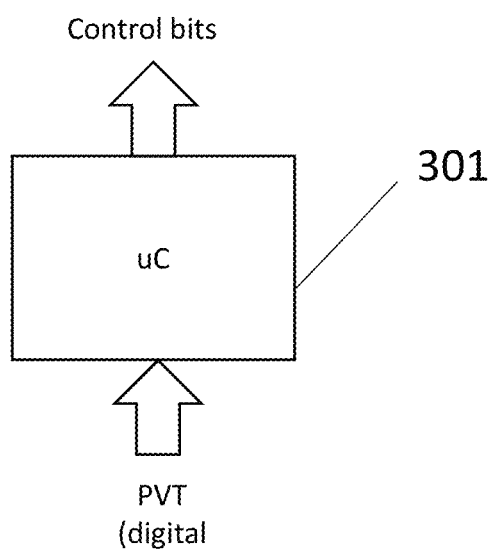
FIG. 3 is a diagram showing a microcontroller implementation of the AI/ML model.

The AI engine 8 of FIGS. 1 and 2 implements the functionality of a trained AI model and may take various forms. For example, as shown in FIG. 3, the AI engine may take the form of a microcontroller 301 that receives as inputs variables such as PVT (Process, Voltage, Temperature) and, in accordance with the trained AI model, outputs control bits for adapting behavior of the target circuit accordingly.

Figure 4:
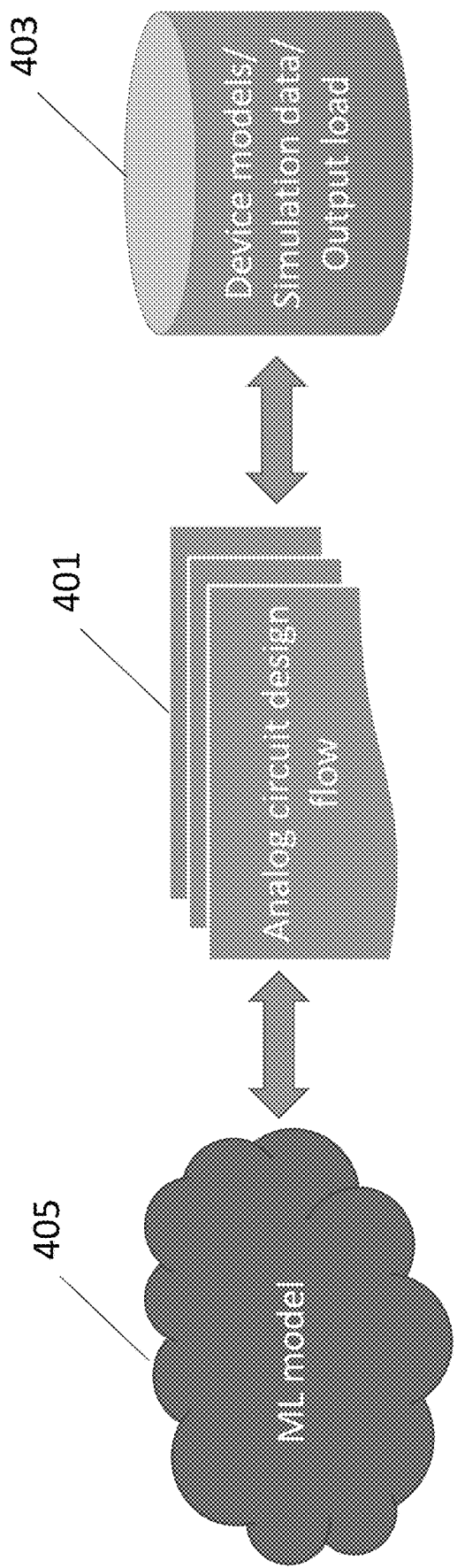
FIG. 4 is a diagram illustrating AI/ML driven circuit design flow.

A generalized representation of the main components of the analog circuit design process in accordance with the described methods is shown in FIG. 4. First, the design process follows the traditional one centered on circuit design, schematic capture and simulation tests (401). Attached to it is a database 403 that may include, for example device models, simulation data and output load data. In the traditional process, all these results are presented to the design engineer to interpret and make decisions about his design. In this new process, this data is used to train an AI/ML model 405 which will be used by an AI engine to infer new results or drive new actions. As a side note, the database may be stored in the cloud to take advantage of cloud-based tools and computational abilities.

Figure 5:
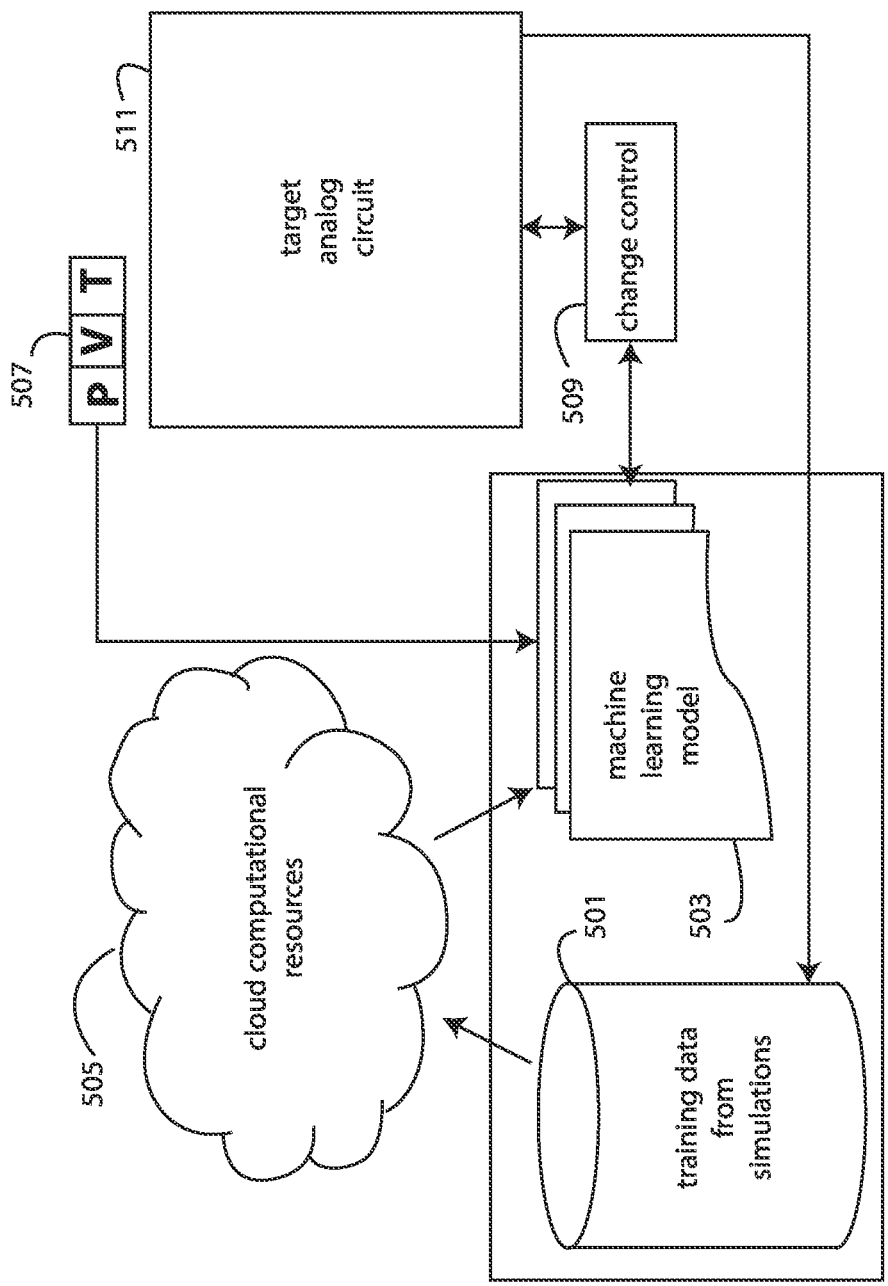
FIG. 5 is a diagram is a diagram showing in greater detail the design flow of FIG. 4.

A more detailed representation is shown in FIG. 5. Using training data from simulations (501), an ML model 503 is constructed and trained using cloud computational resources 505. That model receives as inputs properly formatted sensor data 507, such as PVT (Process Monitor, Voltage and Temperature) data, etc., and produces by inference digital output signals that are applied to a change control circuit 509. The change control circuit functions to adapt operation of the target analog circuit 511 to achieve the desired performance characteristics under those changed conditions, or conditions not known in detail at design time.

An exemplary design flow of a self-adapting analog circuit will now be described in relation to FIGS. 6 and 7.

Figure 6:
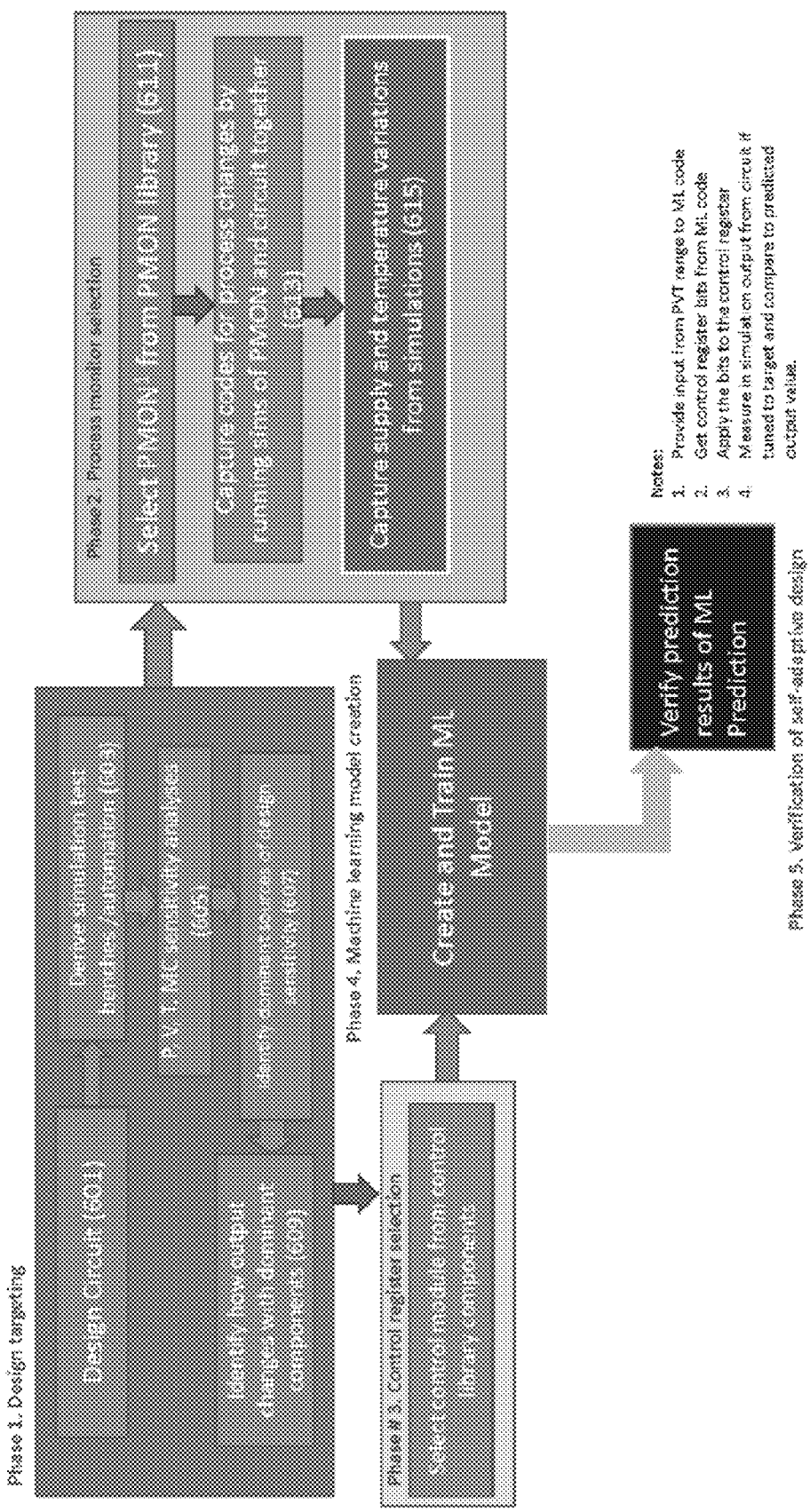
FIG. 6 is a flowchart illustrating phases and steps and the design flow of FIGS. 4 and 5.

Referring first to FIG. 6, Phase 1 of the design flow may be referred to as "design targeting" which is the process of developing the target circuit configuration that meets the desired functionality and specifications. The base analog circuit is designed (601). Monte Carlo and sensitivity analyses in relation to the variables PVT (Process, Voltage, Temperature) and any other relevant variables are performed by simulation (603, 605). From the results, the dominant sources of design sensitivity are identified (607). Simulation results are thus used to create the knowledge base to later build the model describing how the circuit behavior is changed with changes in the identified dominant components (609). Simulation test benches are designed that automate simulation batches and data analysis.

In Phase 2, a process monitor circuit (PMON) is selected from a library or designed for the purpose (611). A PMON may consist, for example, of a ring oscillator and a counter. In accordance with process, voltage and temperature (P,V,T) variations, the ring oscillator may run faster or slower. Hence, differences of the pulse count during a given period of time from a reference are indicative of PVT variations. By running simulations of the analog circuit and the process monitor circuits together (613), correlation data of circuit output changes with PVT changes is captured (615). This correlation data is used to build the machine learning model in subsequent steps.

In Phase 3, a control module is selected from a library of components (if available or build for the purpose), knowing the dominant sources of design sensitivity. This control module has two sections: the control section and the adaptation section. The adaptation section consists of the circuit components attached to or integrated with the circuit functional section. Properly activated by the control section, these components will change the behavior of the circuit functional section as desired. Typically, the control module will allow for digital control of analog components like MOSFET sizes, resistance values, capacitance values, etc. In more complex implementations, full functions such as amplifier stages, current references, filters, etc. can be present and activated as part of the self-adaptation process. The number of digital control bits decides the resolution of the correction. A tradeoff may be made between the number of bits of the control module (resolution) and power and area. All this information about the interaction between the control module and the circuit is used to build the ML model.

In Phase 4, information from the prior phases 2 and 3 is used to build the machine learning (ML) model. Cloud computing resources (which may include clusters of CPUs/GPUs, for example) may be used to crunch the large dataset and perform all the necessary computational tasks to train and build the ML model. The ML model takes a certain PVT condition as input and outputs the control bits for the control module, where the control bits will drive the circuit changes to adapt the operation of the functional circuit to cause it to operate more nearly as intended.

Finally, in Phase 5, verification of the adaptive design is performed. The verification process consists of the following steps. For a random set of PVT conditions, the ML model is activated to infer the control register bits necessary to perform the self-adaptation to affect the circuit in the desired manner, typically reflected by certain characteristic of its output (e.g. current, voltage, etc.). To verify the accuracy of the ML model, its inferred output is compared to that obtained from the simulation data for the same PVT condition. If the error is below a certain percentage, the ML model is deemed accurate. The process is repeated for a large number of PVT conditions.

Figure 7:
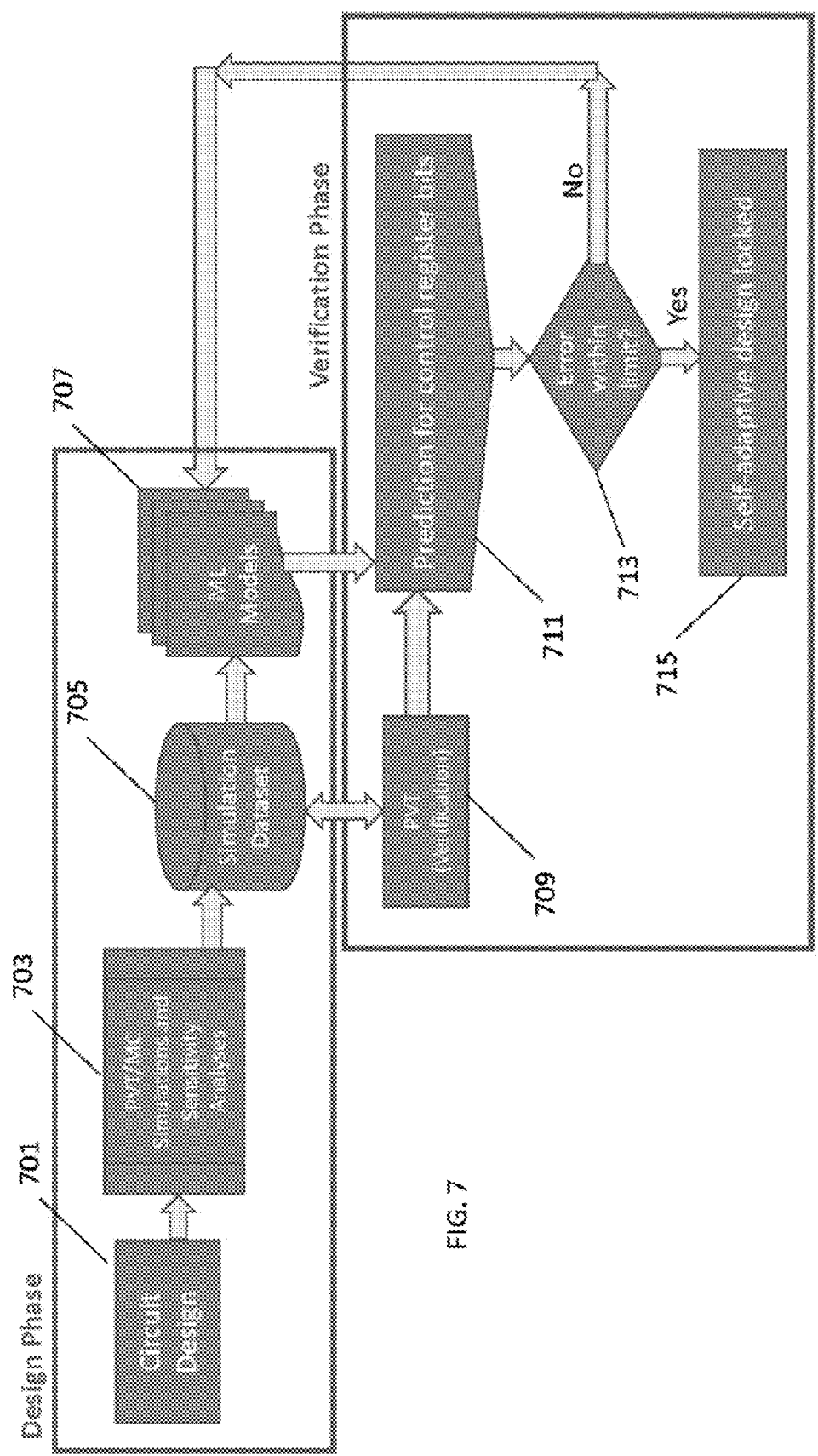
FIG. 7 is another flowchart illustrating selected details of the design flow of FIG. 6.

Another representation of the design and verification phases of a circuit is shown in FIG. 7.

In the design phase, a base circuit is first created (701). From simulation results, PVT sensitivity analyses are performed to find the dominant analog components of the circuit having the greatest effect on circuit outputs, and to measure the relationships between PVT, dominant components and circuit behavior (703), resulting in a simulation dataset 705. Such relationships and sensitivity are used to build the ML model 707.

The verification phase (including prediction of control register bits 711 in response to PVT data 709) is as described in the previous paragraph. If the error is within a desired limit for all the verification data (713), the self-adaptive design is considered "locked (715)," meaning no further changes are needed. Otherwise, the ML model is further refined to bring the error to within the desired limits.

The machine learning model is a representation of the behavior of the circuit block under the range of environmental and usage condition variables. The environmental and usage condition variables are the input variables to the model. Their relationships to the output are determined from the data obtained from the simulations and implemented into the model through the training process. The training process is shown in FIGS. 8 and 9.

The training process consists of four steps:
a) perform sensitivity analyses to determine the input variables that most affect the output and eliminate those that do not,
b) split the data set into training and testing subsets,
c) use the training data subset to calculate the parameters of the machine learning model with a regression algorithm, and use the test data subset to verify that the model is accurate because it can estimate the output for that subset of inputs (test data) with little error, and
d) continue to improve the accuracy of the model through guided learning until certain accuracy criteria (L1norm, L2norm, $R^2$ score) are met.

Figure 8:
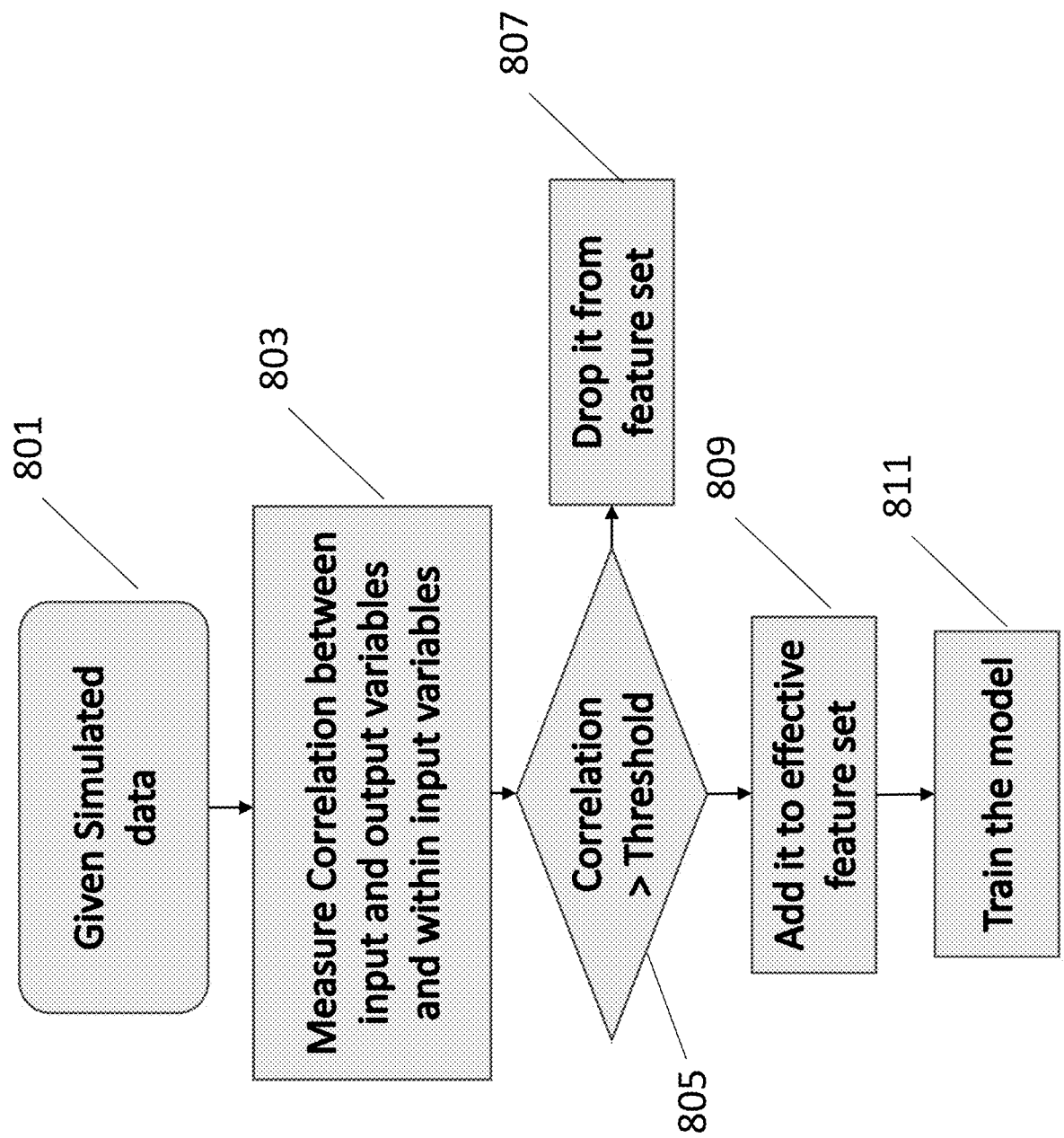
FIG. 8 is a flowchart illustrating formulation of an AUML model.

FIG. 8 shows the process to convert and refine the simulation data to useful information to train the ML model. As discussed, only meaningful relationships are modeled, and dominant components are taken into account in the creation of the ML model. In the process (step 803), correlations between input variables (PVT, dominant components, etc.) and output variables (current, voltage, etc.) are calculated from the simulation data (801). If the correlation between a certain input variable and the outputs is above a certain threshold (805), that variable is added to the "effective feature set" (809). The process is repeated for all the input variables and output variables then the results are used to build and train the ML model (811). This method gives a feature set with enough variables to make accurate prediction. Eliminating the irrelevant variables (807) reduces the model complexity and execution time.

Figure 9:
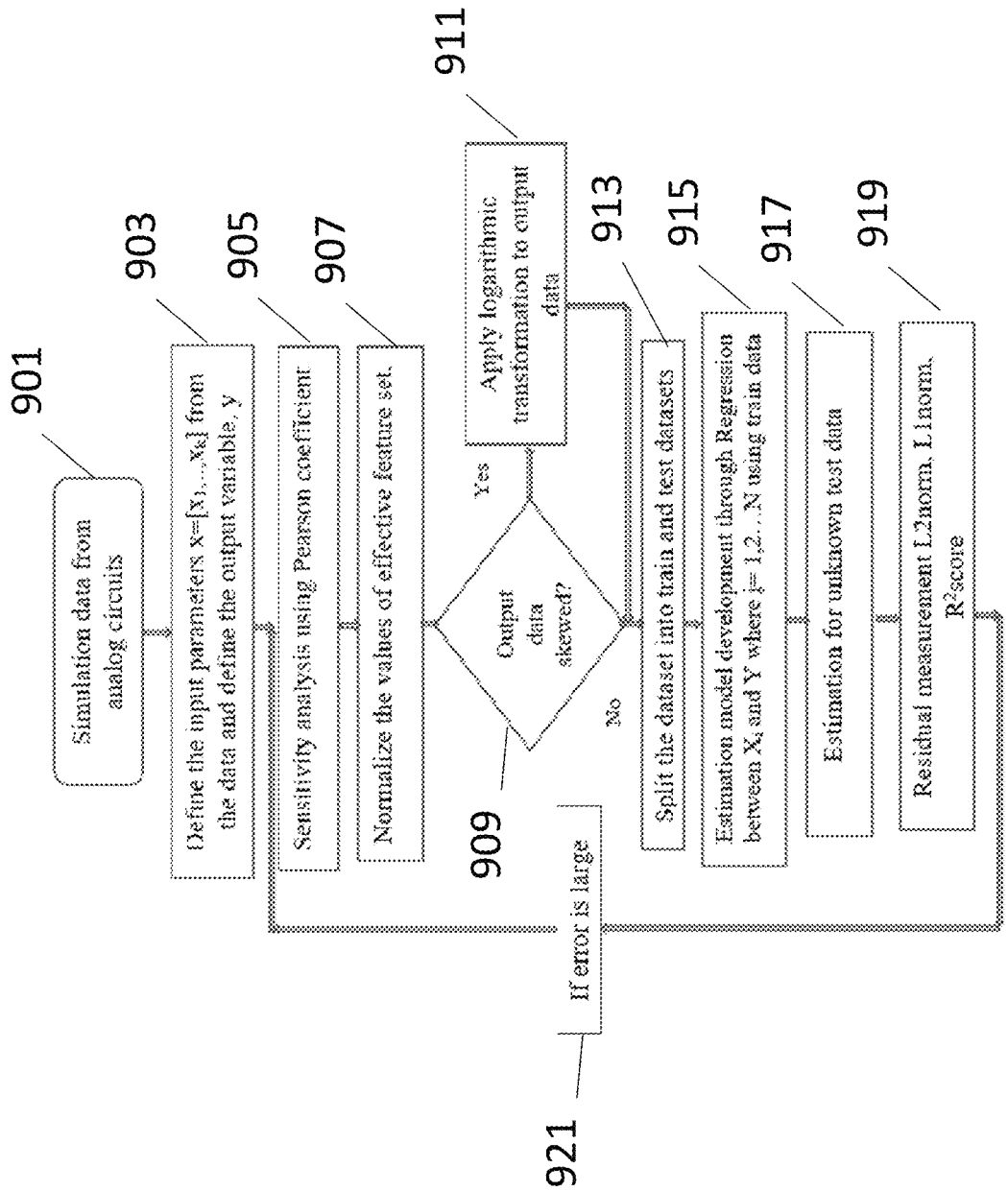
FIG. 9 is a flowchart illustrating AUML model training.

FIG. 9 shows the training and testing process in general. Starting from simulation data (901), the set of input and output variables is defined (903) and sensitivity analyses are performed using the Pearson Coefficient method (905) to find the correlation factors between the input variables and the desired output variables. Once the feature set is defined, normalize its values (907). If the output data is skewed (909) by the fact that some input variables are much more influential than others, apply the logarithmic transformation (911) to reduce the sensitivity so that the prediction from the ML model can converge faster to a solution. The simulation data is divided into training data used to train the ML model and testing data used to verify the accuracy of the model (913). For example, 90% of the data may be reserved for training and 10% for testing. Training of the ML model (913) can be done by one of the many available regression methods such as Multiple Polynomial, Gradient Boosting, etc. The ML model is a mathematical representation of the circuit. For simplicity, it may be assumed to consist of a number of equations describing the relationships between the input and output variables. The relationships are mathematically represented by the coefficients of the equations. The training process is complete when all the coefficients are defined and the equations accurately represent the relationships between the inputs and outputs. The training process utilizes 90% of the simulation data to run through the regression process to calculate the coefficients of the equations. Once the training is complete, the model is capable of inferencing or predicting the outputs of any set of inputs. To test the trained ML model, its inferred outputs are compared to that obtained from the simulation data for the same set of inputs (917). If the error or residual is below a certain threshold (represented by $L_{1norm}$, $L_{2norm}$ and $R^2$ score in step 919), the ML model is deemed accurate for that particular set of inputs. If the error is large (921), modeling steps may be repeated and refined as needed. The process is repeated for all of the 10% of the simulation data reserved for testing.

A circuit block is not limited to a single control circuit for purposes of adaptation of a single output. Multiple such control circuit may be provided within a single analog circuit block to perform adaptation of multiple outputs. An AI/ML model may be constructed that accounts for multiple control circuits and that produces multiple control signals corresponding to the multiple outputs.

Figure 10:
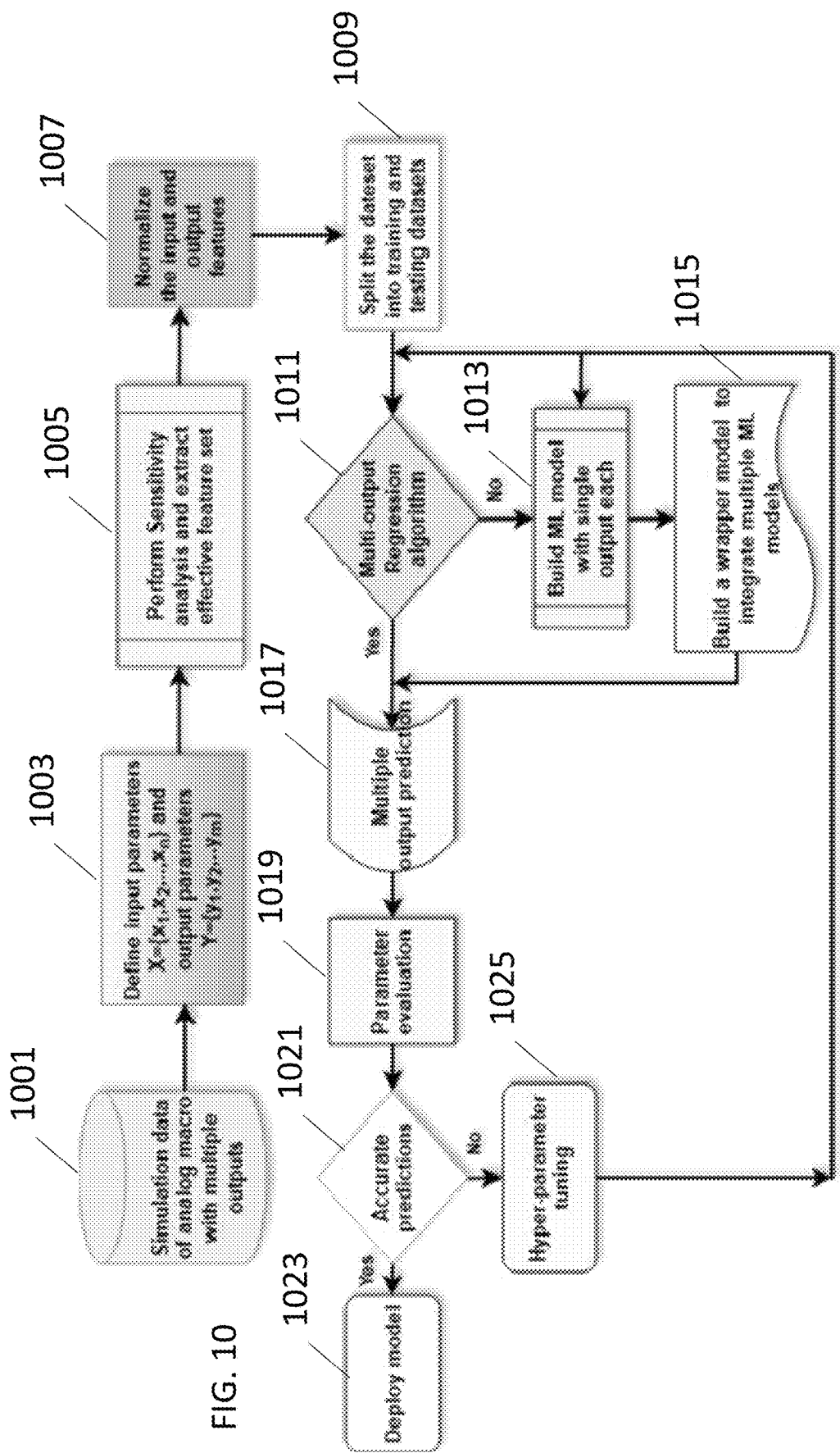
FIG. 10 is a flowchart illustrating AI/ML model training for multiple outputs.

An example flowchart of a procedure for modeling a circuit block is shown in FIG. 10. As stated before, the process starts with simulations and sensitivity analyses to determine the most relevant correlations between the inputs and desired outputs (1001, 1003). The set of relevant variables (the feature set) is then built (1005). Normalization is performed as necessary (1007). Next, the training and test datasets (1009) applicable to all inputs and outputs are created then used to build the ML model for each of the multiple outputs (1011, 1013). A wrapper model is created next to integrate the individual ML models (1015). The next step is to verify that the integrated model generates accurate prediction results of all relevant input and output combinations (1017, 1019, 1021). If it does not, the full model may be retuned by adjusting hyperparameters (1025). Hyperparameters are internal scaling parameters to tune the top level ML model towards reducing the error (through L1 norm or L2 norm) between actual and predicted results. Finally, the model is deployed (1023).

Example: Analog Current Reference Circuit

Referring to FIG. 11, a circuit diagram is shown of a current reference circuit, a common analog circuit that may be reused many times in an integrated circuit.

Techniques described thus far may be used to perform compensation of various instances of the current reference circuit throughout an integrated circuit. Specifications of the current reference circuit are shown in FIG. 12. The PVT ranges are as follows:

| PVT Conditions | Min | Typ | Max |
| --- | --- | --- | --- |
| Process Corners | SS | TT | FF |
| Supply Voltage (Volt) | 0.72 | 0.8 | 0.88 |
| Temperature (degrees C.) | −55 | 25 | 125 |

In the above table SS denotes one of the worst case process condition called "Slow NMOS, Slow PMOS", meaning that both the NMOS and PMOS transistors have some weaker electrical characteristics that reflect in lower process monitor frequencies, i.e. they run slower. The other corners are TT, meaning "Typical NMOS, Typical PMOS" and FF for "Fast NMOS, Fast PMOS".

Referring to FIG. 13, a block diagram is shown of an arrangement for performing compensation of the various instances of the current reference circuit, $IR_1$-$IR_n$. Adaptation Control circuitry comprising of PVT Sensors 1301, Bias Mux 1304, Selector Logic 1305, Bias Sense/ADC 1306, ML Model 1307, and Control Circuit 1309 is shared between the various instances of the current reference circuit, thereby economizing on area and power.

PVT sensors inputs are obtained from sensor circuitry 1301 and are converted to digital form in the Bias Sense/ADC block 1306. A selector circuit 1305 is used to select which instance of the current reference circuits $IR_1, \ldots IR_n$ will be compensated at a particular time. The Bias Mux 1304 selects which instance output of $IR_1, \ldots, IR_n$ to send to the Bias Sense/ADC 1306 to convert to digital form. The digitalized outputs of the PVT Sensors 1301 and of the Sense/ADC block 1306 are applied to an ML block 1307. The ML block represents either a hardware or a cloud-based sub-system that includes a representation of an ML-trained model that models the behavior of the current reference circuit usually stored in memory, and an execution unit. In some embodiments, that implementation may be a microcontroller system or the like. In some instances, the model implementation may take the form of a lookup table, or LUT, with or without interpolation.

In response to the sensor inputs, the ML block produces a control signal in the form of digital bits, which are applied to a control circuit 1309. The control circuit 1309 may include adaptation circuitry for each instance of the current reference circuit. For purposes of description, this adaptation circuitry is illustrated as being part of a single block. In actual practice, the adaptation circuitry will be distributed among the various instances of the current reference circuit.

In response to the control signal from the ML block, and under control of the selector circuit, the compensation circuitry within the control circuit for a particular instance of the current reference is controlled so as to compensate for the influence of the variables PVT.

In the case of the current reference circuit, the bias voltage $V_B$, indicative of the reference current $I_B$, is, after translated into a suitable digital code, taken as an input by the ML model. In the more general case, an input indicative of the state of operation of the circuit to be compensated may or may not be explicitly available but the overall process remains valid.

Figure 16:
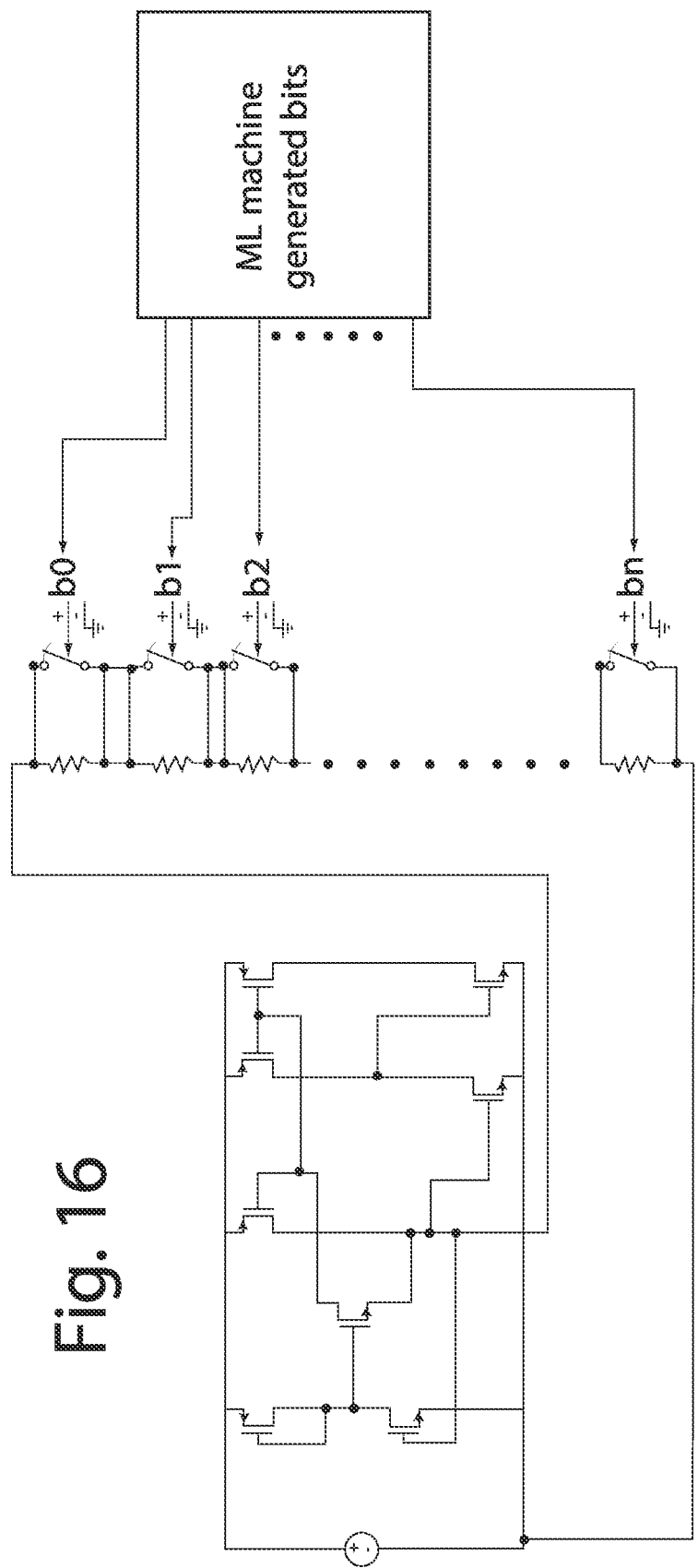
FIG. 16 is a diagram of the analog circuit of FIG. 11 together with AUML adaptation circuitry.

A more detailed diagram of a single instance of the current reference circuit, together with a portion 1309' of the control circuit 1309 (FIG. 13) pertaining specifically to that instance, is shown in FIG. 16.

The current reference circuit is shown as including a startup circuit that applies a perturbation at startup to cause the current reference to enter normal operation. The portion 1309' of the control circuit 1309 may take the form of switches $S_1$-$S_n$ used to control the value of the resistor between circuit nodes $N_1$ and VSS. By controlling this resistance value in accordance with the output of the ML model, the current reference circuit may be suitably compensated.

Figures 14, 15:
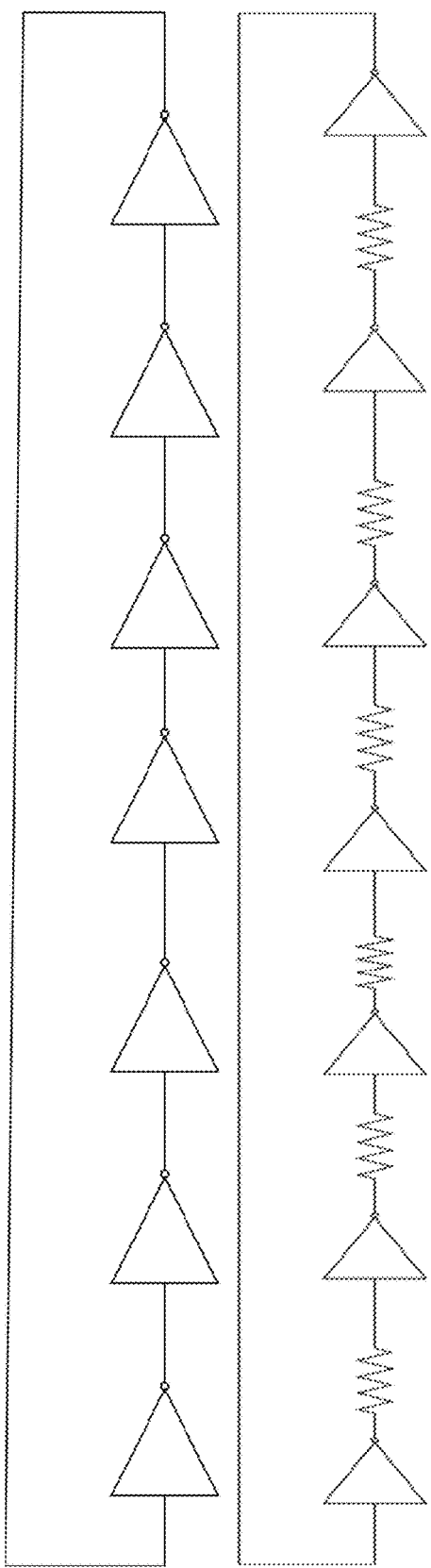
FIG. 14 is a circuit diagram of a process monitor circuit that may be used with the analog circuit of FIG. 11.
FIG. 15 is a circuit diagram of another process monitor circuit that may be used with the analog circuit of FIG. 11.

Two different process monitor circuits, shown in FIGS. 14 and 15, may be used to monitor the performance characteristics of the key components in the analog integrated circuit, in this case the current reference circuit. Such performance varies in accordance with semiconductor manufacturing process variations. These process monitor circuits may be shared between the various instances of the current reference circuit. In a typical integrated circuit, it is a common practice to place a set of PVT sensors next to the local current reference circuit to make the adaptation most accurate for each unit due to on chip variations at each location, especially for large chips like the iPhone's Application Process. The process monitor circuits may be ring oscillator circuits, for example, designed to operate at nominal frequencies f1 and f2. The ring oscillator frequencies will change according to the performance of the key components, voltage and temperature. By monitoring those frequencies at fixed voltage and temperature, one can determine whether the process is "fast" (FF), "typical" (TT) or "slow" (SS). A "fast" process would be shown by higher oscillator frequencies. The ring oscillators can also be designed so reflect the performance of a specific component type caused by process variations. For example, the processor monitor circuit of FIG. 14 is designed to monitor the performance of the NMOS and PMOS together while that of FIG. 15 is designed to mainly reflect the performance of the resistor. The actual ring oscillator frequencies are converted to digital values with a standard method such as using counters. By counting the number of oscillator pulses during a determined time period, the frequency can be deduced.

The Bias Sense/ADC block 1306 is configured to take the bias voltage $V_B$ indicative of the $I_{ref}$ current and convert it to digital format with an internal analog-to-digital converter or ADC. In other implementations, $I_{ref}$ itself is converted to digital format.

ML modeling may be done, for example, using existing Open Source tools such as Spyder, Jupyter notebook from Anaconda, coupled with a standard language like R or Python. Anaconda is a free and open-source distribution of the Python and R programming languages for scientific computing. A large training data set is obtained by performing simulations of the circuits and process monitors with many PVT data points.

In the illustrated example of FIG. 17, 41,393 simulations with different values of PVT were run and results delivered for ML model generation. That training data set included the 41,393 samples, with 90% of them split out for model training and 10% for model testing. The training data set is used to calculate the internal parameters of the machine learning model. The test data set is used to verify that the model is accurate because it can estimate the output for that set of "unknown" test data with little error. The accuracy of the ML model is then assessed by comparing its predicted values of $I_{ref}$ across the PVT range to those from simulation results. FIG. 17 shows the statistics of the results. In the first row, the actual mean value of $I_{ref}$ obtained from all the 41,393 simulations is compared with the mean value of the predicted value of $I_{ref}$ for the same set of PVT conditions. Similarly, the second and third rows of the table in FIG. 17 show the standard deviation and variance of $I_{ref}$. The fourth column shows that the error percentages of the mean, standard deviation and variance of $I_{ref}$ are very small, confirming that the created ML model is very accurate.

Figure 18:
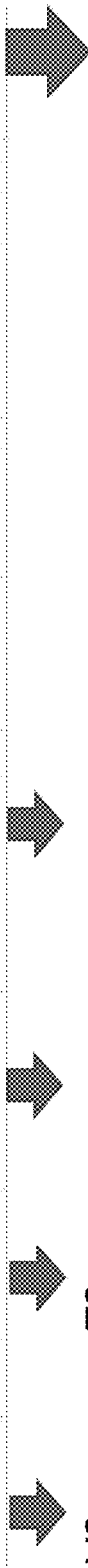
FIG. 18 is a diagram showing further details of AUML adaptation for the circuit of FIG. 16.

Further reference is now made to FIGS. 11, 12, 13, 16, and 18. The value of the reference current $I_{ref}$ is strongly dependent on the value of the resistor R in FIG. 11, and on the electrical characteristics of the NMOS and PMOS devices. As the input conditions P and T change, the reference current $I_{ref}$ would vary significantly. However, $I_{ref}$ is somewhat independent of the supply voltage V. All these relationships will be clearly explained below in the descriptions of FIGS. 19-22. The task is to use the ML model to find the value of the resistor R of the reference circuit in FIG. 11 that is required to bring the value of the reference current $I_{ref}$ to the nominal value of 10 uA as shown in FIG. 12 then create a code for the control circuit to turn on the right switches in FIG. 16 to adjust the resistor value accordingly. In FIG. 18, columns 1-4 contain digital codes for PVT data, with column 3 containing digital code of the frequency f1 from the first process monitor circuit of FIG. 14 and column 4 containing digital code of the frequency f2 from the second process monitor circuit of FIG. 15, under the particular process and voltage conditions represented by the digital codes in columns 1 and 2. Column 6 contains the desired resistance value to be set by operation of the adaptation circuit within the current reference circuit of FIGS. 12 and 16, according to the input conditions shown in columns 1-4. Columns 5 and 7 are current values as predicted by the LGBM model and values obtained from simulations. So, for the first row, the model estimates the reference current to be 9.32 uA and the needed resistance R to be 53,610 ohms. Compared to that the simulation shows 9.34 uA. Therefore, the difference between the 10 uA nominal current and that of the LGBM is 10-9.32=0.68 uA. That difference is encoded into a string of 6-bit data to send out to correct the resistor value to 53,610 ohms. Because the predicted value by the LGBM model is very accurate, we are confident that the 6-bit code is accurate, and the adaptation is done accurately as well. Column 8 contains the 6-bit control register code calculated to obtain the desired resistance value. The 6 bits of the code of each row in column 8 are the b0, b1, bn bits driving the NMOS switches in FIG. 16. The reference current is heavily dependent on the value of the resistor R shown in FIG. 11. In FIG. 16 which shows the actual implementation, the resistor is divided into multiple segments connected with the respective switches that are controlled by the digital bits b0, b1, bn. A switch that is turned on will short out the resistor it controls, ideally making it zero. An off switch will leave the resistor it controls at the nominal value. By turning on and off certain switches according to a defined digital code, one can adjust the total value of the combined resistor which is the sum of all the un-shorted resistor segments.

In the present example, two models of the relationship between the current and input parameters i.e. resistance, temperature and supply voltage, were implemented, one with the Light Gradient Boosting Model and the other with Polynomial Regression Model. Both models gave accurate prediction results for the reference current. The $R^2$ scores for both models were greater than 99%, and the errors in the mean and standard deviation were below 1%.

FIG. 18 shows the results of the Light Gradient Boosting Regression Model (LGBM). The LGBM Delta number shown in each row of column 5 is the difference of the reference current between the nominal value and the one predicted by the LGBM (Light Gradient Boosting Model) for the particular PVT set of conditions in each row. However, since there are only 6 bits in the code, there is a very small 0.02% error between the predicted $I_{ref}$ value in column 5 and the reference value (obtained from simulation) in column 7 when the self-adaptation was implemented with the 6-bit code in column 8.

In order to set up the machine learning model, the sensitivity relationships between the reference current and the P,V,T input variables may be ascertained by performing numerous simulations of the process monitors and the functional circuit. The variable-pair plots of the types shown in FIGS. 19-21 graphically describe the sensitivity between the respective input variables P,V,T and the reference current. Simulation results were captured then post-processed in MATLAB and presented in graphical format for better visibility.

Figure 19:
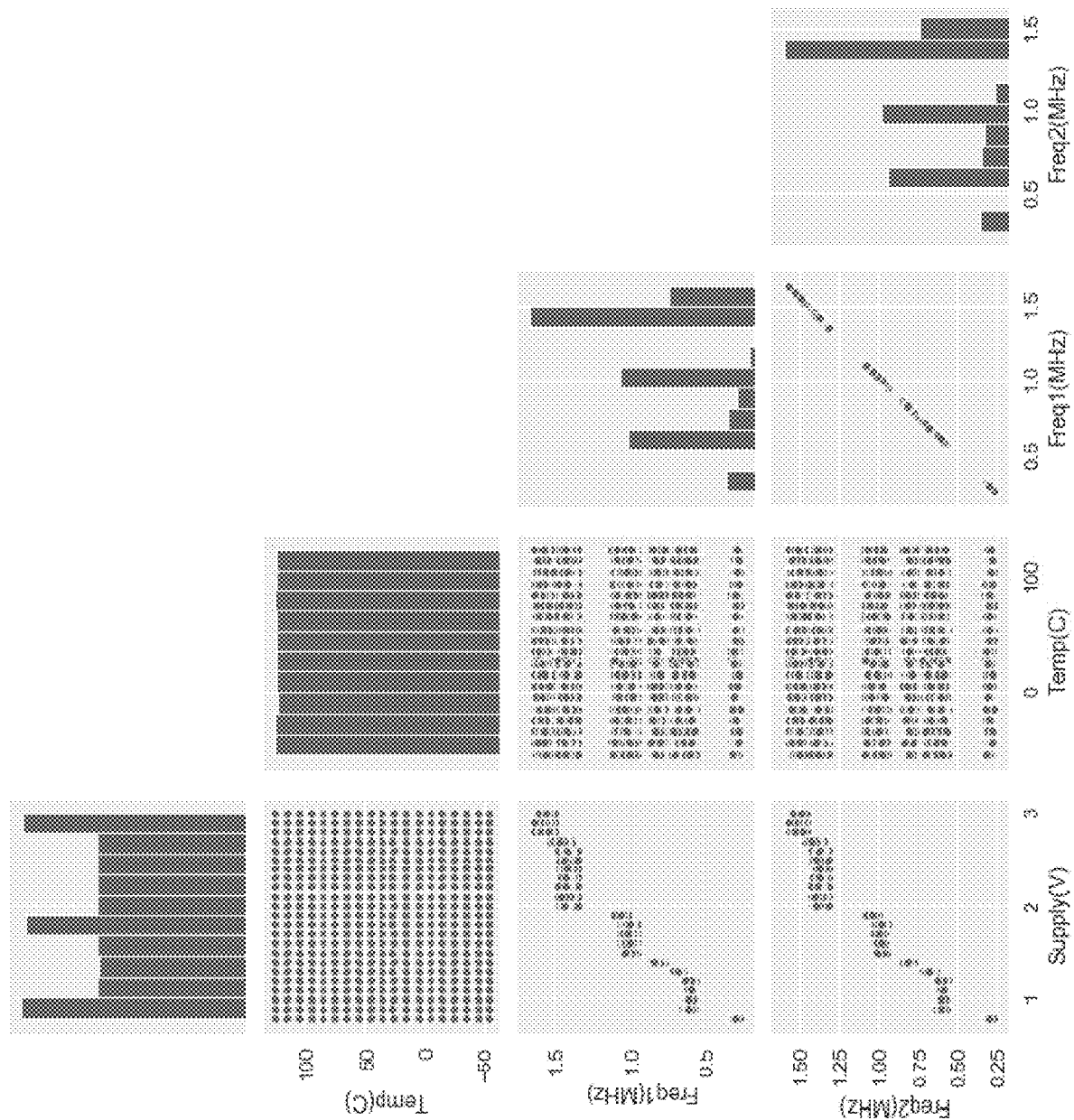
FIG. 19 is a diagram showing simulation results used in formulating an AUML model for the circuit of FIG. 16.
Figures 20, 21:
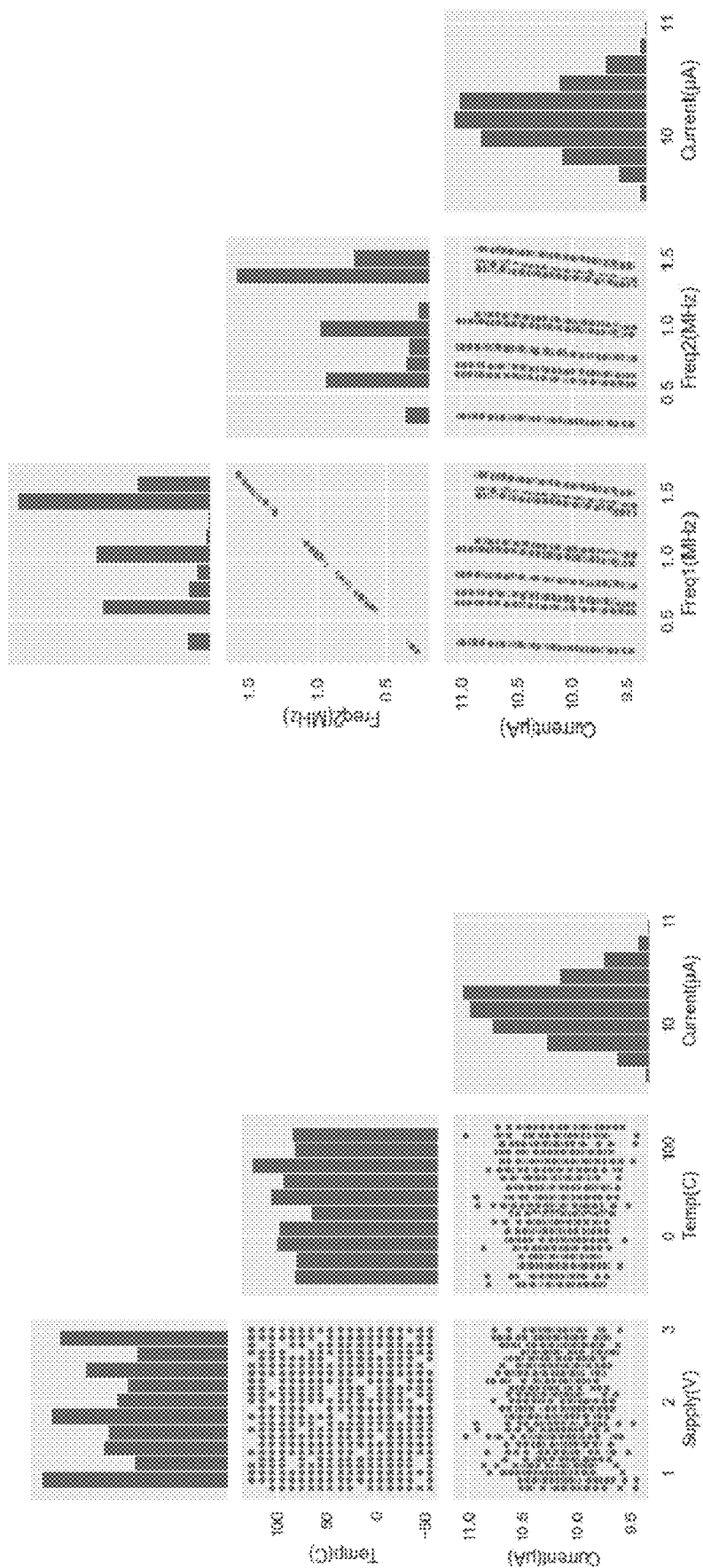
FIG. 20 is another diagram showing simulation results used in formulating an AUML model for the circuit of FIG. 16.
FIG. 21 is another diagram showing simulation results used in formulating an AI/ML model for the circuit of FIG. 16.

In the lower left-hand corner of FIG. 19, for example, the frequency f2 of the process monitor in FIG. 14 is shown as a function of the supply voltage V. The graph above it shows the frequency of the process monitor in FIG. 15. The graph to the right of it shows the variations of the frequency with temperatures. The second graph to the right of it shows the correlation between the frequencies f1 and f2 of the two process monitors. Finally, the right most graph shows the statistical distribution of frequency 2 over the full range of values of voltage, temperature and f1. The graph at the lower left corner of FIG. 20 shows the variation of the reference current (the output) with supply voltage. The graph to its right shows its variation with temperature. The graph at the bottom right corner of FIG. 20 shows the statistical distribution of the reference current over the full range of voltage and temperature. The graph at the lower left corner of FIG. 21 shows the variations of the reference current with the frequency f1 of process monitor 1 in FIG. 14. Since the frequency f1 varies with the performance of the process (fast, typical, or slow NMOS and PMOS devices), the graph effectively shows the variations of the output with the characteristics of the process. Similarly, the graph to its right shows the variations of the reference current with the frequency f2 of process monitor 1 in FIG. 15. Since the frequency f2 varies mostly in accordance with the value of the resistor, the graph effectively shows the variations of the output with the value of the resistor. Finally, the graph at the lower right corner of FIG. 21 shows the statistical distribution of the reference current over the full range of f1 and f2 values, i.e. the full range of process variations.

Figure 22:
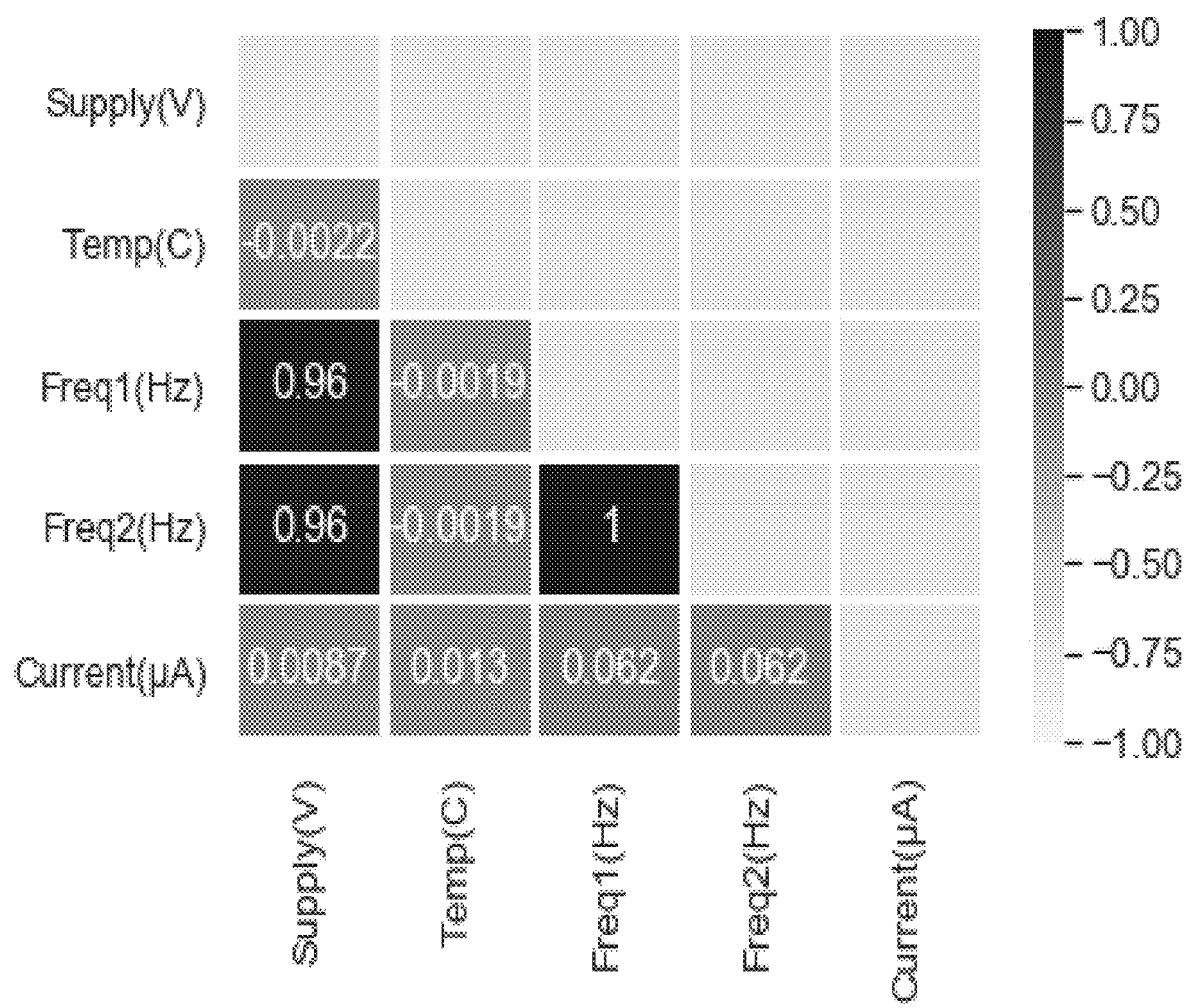
FIG. 22 is a sensitivity chart related to the simulations of FIGS. 19-21.

Using the simulation results showing the degrees of correlation between the various variables and the output in FIGS. 19-21, a "heat map" like that of FIG. 22 may be generated, showing sensitivity between variable pairs. The variable pair Freq1 and Freq2, for example, shows complete correlation, and is therefore shown as being "hot" as indicated by the dark blue square corresponding to the value 1 in the color scale at right. The variable pair Temp and Freq1, on the other hand, shows a much lower degree of correlation. The parameters are said to be highly positively correlated if correlation factor is closer to 1 and strong negative correlation if the value on the scale is closer to −1. If the value is around 0 on the scale, then they are not correlated. From the above heat map, f1 and supply voltage, f2 and supply voltage, and f1 and f2, are highly correlated. Specifically, the correlation factor 0.0087 of the current with supply voltage is very small, confirming the fact that the circuit is indeed meeting its design goal for the $I_{ref}$ current to be independent of the supply voltage. In contrast, the $I_{ref}$ current is shown to be much more dependent on the temperature with a correlation factor of 0.013. The blue color of the square indicates based on the vertical scale at the right that the correlation is positive, meaning the current increases with temperature. The current is even more dependent on frequencies f1 and f2 with correlation factors of 0.062. The correlation factors shown in the heat map are used as inputs to build and train the machine learning model.

In the illustrated example of FIG. 17, 41,393 simulations with different values of PVT were run and results delivered for ML model generation. That training data set included 90% of the 41,393 samples, with the remaining 10% of them split out for the test data set. FIG. 17 shows the statistics of the mean, standard deviation, variance, and errors of the predicted values of the reference current across the PVT range.

Figures 23, 24, 25, 26:
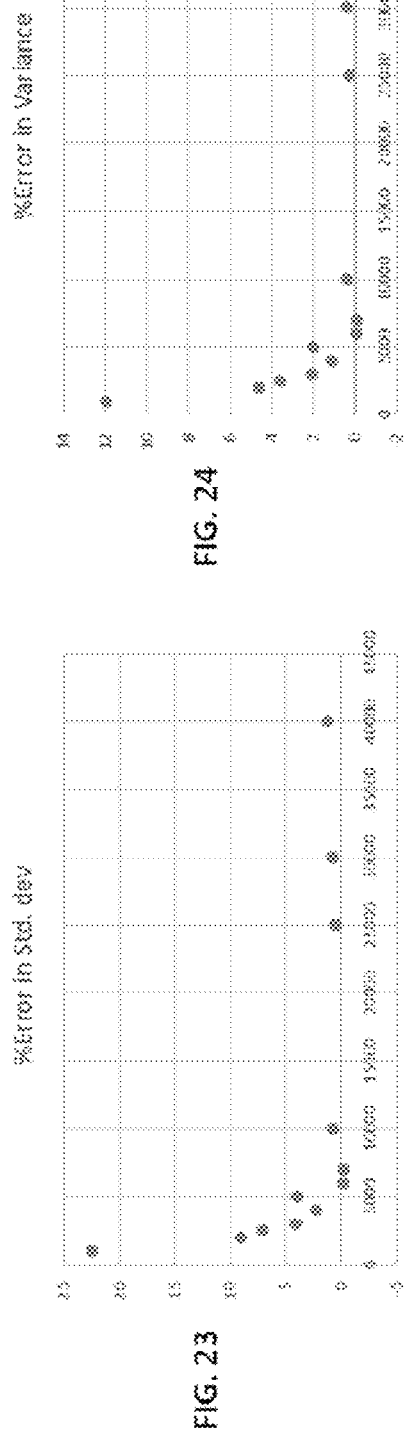
FIG. 23 is a graph showing a statistical aspect of AUML-adapted performance of the circuit of FIG. 16 as function of number of samples.
FIG. 24 is another graph showing a statistical aspect of AI/ML-adapted performance of the circuit of FIG. 16 as function of number of samples.
FIG. 25 is another graph showing a statistical aspect of AUML-adapted performance of the circuit of FIG. 16 as function of number of samples.
FIG. 26 is a graph showing, in connection with the circuit of FIG. 16, compute time for AUML model training as a function of the number of samples.

As expected, the number of samples used for learning, i.e. to build the model, typically have a great influence on the accuracy of the ML model. As the number of samples increases toward 45,000, the percent error in standard deviation, variance and mean tend toward zero (FIGS. 23, 24 and 25, respectively). The required compute time for training of the model of course increases (FIG. 26).

Figures 27, 28:
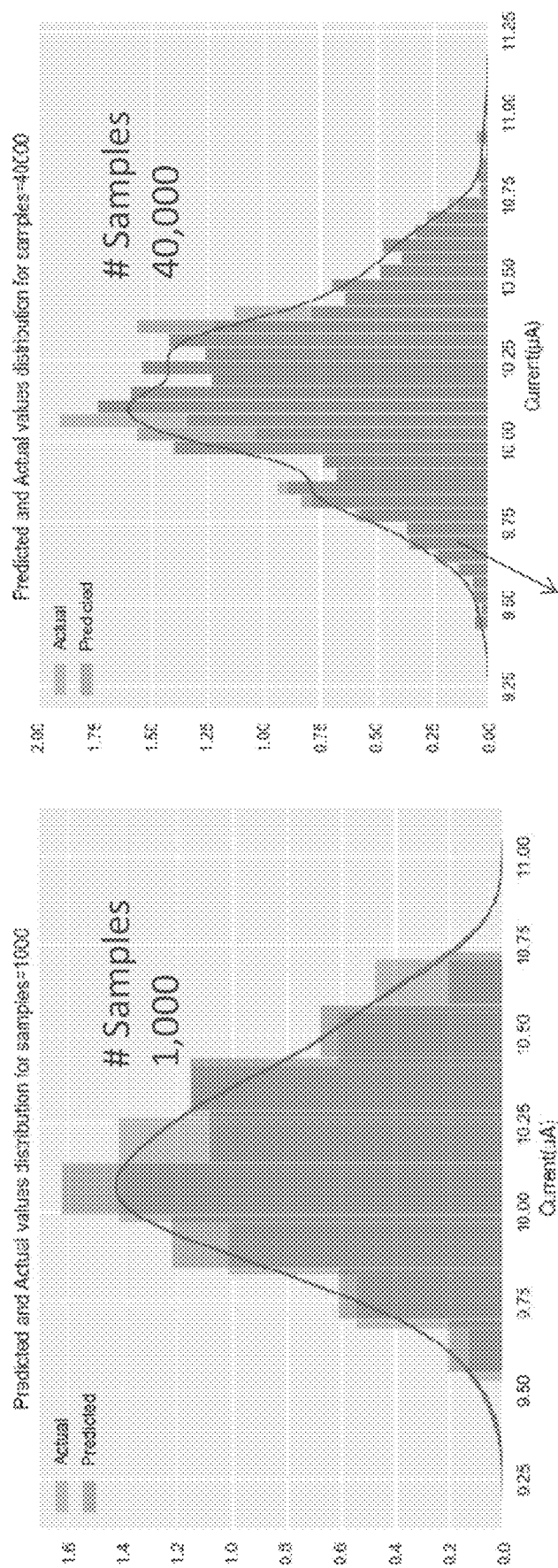
FIG. 27 is a graph illustrating AUML-adapted performance of the circuit of FIG. 16 in accordance with 1,000 samples, a 90% sub-set of which are used for training.
FIG. 28 is a graph illustrating AI/ML-adapted performance of the circuit of FIG. 16 in accordance with 40,000 samples, a 90% sub-set of which are used for training.

FIGS. 27 and 28 further emphasize the increased accuracy with the number of samples. The histograms of the actual (based on simulation results) and predicted values of $I_{ref}$ with 1,000 PVT samples used to build the ML model show significant mismatch while the histogram of the model built with 40,000 samples show almost perfect overlap, proving that the latter model is very accurate.

The capability of ML model is then proven on several specifications of the current reference circuit shown in the Specs table of FIG. 12. In response to the control signal from the ML execution block, and under control of the selector circuit, the compensation circuitry within the control circuit for a particular instance of the current reference is exercised so as to compensate for the influence of the variables PVT. As shown in FIG. 18 the ML model will predict the value of the resistor R required to adapt the current reference circuit to the changed PVT conditions and bring the desired spec back to as close to the nominal value as possible. It then generates the code for the adaptation section to change the value of R accordingly. Examples of the results of the self-adaptation are shown in FIGS. 29-33.

Figure 29:
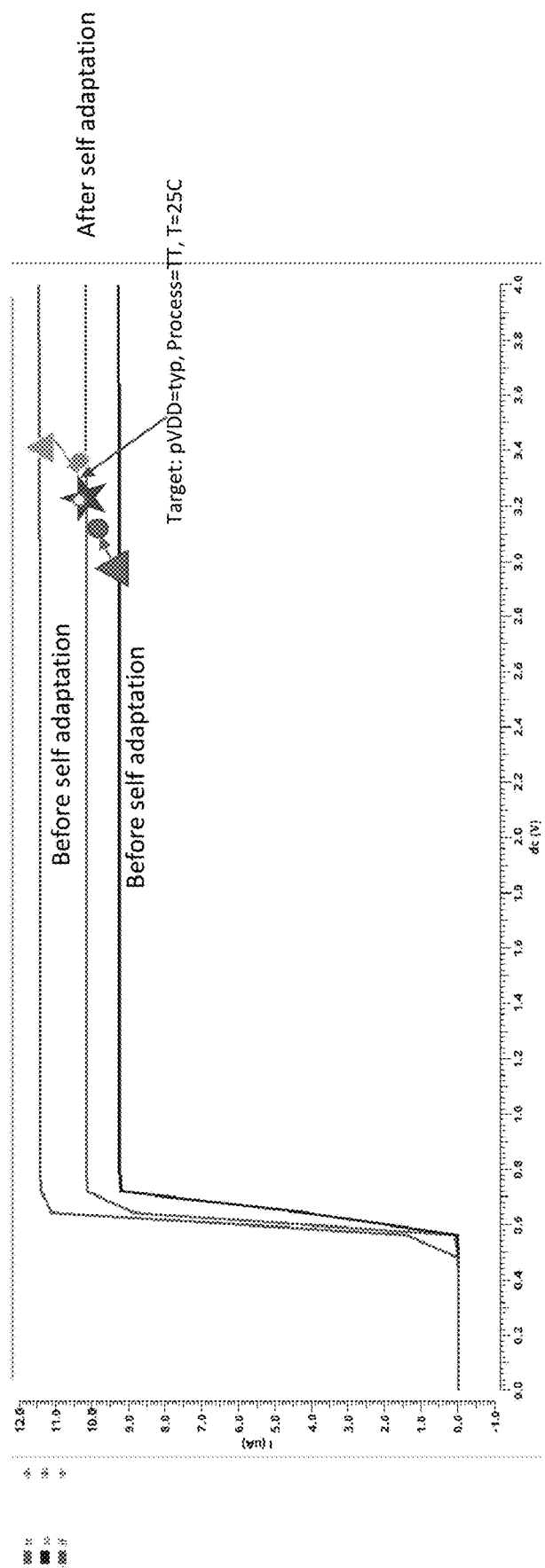
FIG. 29 is a graph showing a performance metric of the circuit of FIG. 16 with and without AI/ML adaptation.

FIG. 29 shows the results of self-adaptation for process variations using the ML model described above for the Line Sensitivity spec of the current reference circuit. Line sensitivity in %/V is the percentage variation of the reference current with the supply voltage. The horizontal axis is the supply voltage. The vertical axis is the value of the reference current as supply voltage changes, for three cases of process variations called TT (red curve), SS (blue curve) and FF (pink curve). Beyond about 0.4V when the current reference starts working, all three curves are essentially flat, indicating that indeed the current reference is almost independent of the supply voltage, as designed. That means that the line sensitivity is very low. The blue, red and pink curves labeled "Before self adaptation" also show that without self-adaptation the current reference values change significantly with process, i.e. from 9 uA to 10 uA and to more than 11 uA when the process changes from "slow" (SS—blue curve) to "typical" (TT—red curve) and "fast" (FF—pink curve). There is a fourth curve colored in orange that shows the reference current $I_{ref}$ after adaptation. Remember the goal of this self-adaptation is to bring the performance at various process conditions (SS and FF) back to that in the nominal condition, which in this case is the TT condition. The adaptation is excellent, so the orange "After self-adaptation" curve exactly overlaps the TT "Before self-adaptation" curve.

Figure 30:
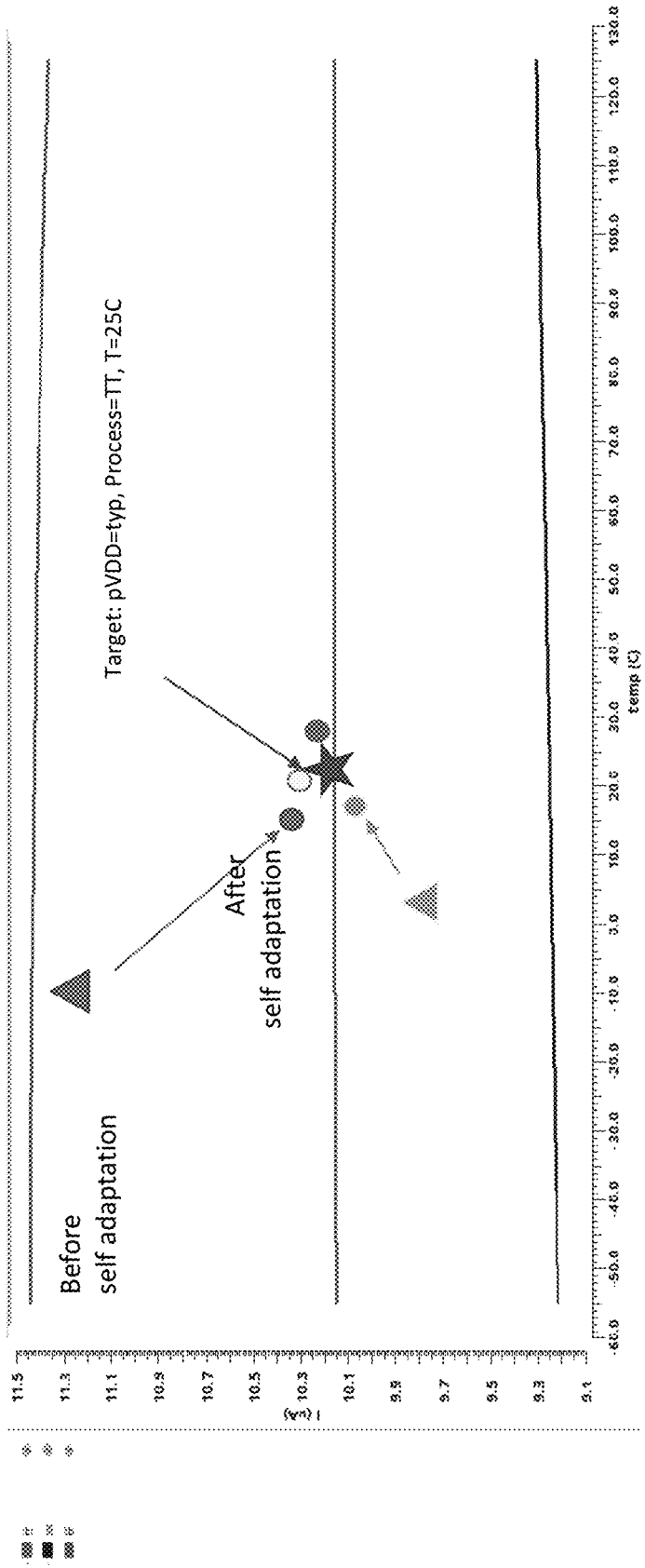
FIG. 30 is another graph showing a performance metric of the circuit of FIG. 16 with and without AI/ML adaptation.

FIG. 30 shows the results of self-adaptation for process variations using the ML model described above across temperature. The vertical axis is the value of the reference current as temperature changes, for three cases of process variations called TT (red curve), SS (blue curve) and FF (pink curve). The blue, red and pink curves labeled "Before self-adaptation" show that without self-adaptation the current reference values change significantly with process and temperature, i.e. from 9.2 uA to 10 uA and more than 11.4 uA when the process changes from SS to TT and FF and temperature from −55 C to +125 C. There is fourth curve colored in orange that shows the reference current with adaptation. Remember the goal of this self-adaptation is to bring the performance at various process (SS and FF) conditions back to the nominal condition, which in this case is the TT condition. The adaptation is excellent so the orange "After self-adaptation" curve exactly overlaps the TT "Before self-adaptation" curve.

Specifications and performance of the self-adaptive current reference are dramatically improved, as shown in FIGS. 31-33.

FIG. 31 shows exceptionally large improvements were achieved via self-adaptation for each individual spec of the current reference circuit as compared to those shown in FIG. 12. For example, the $I_{ref}$ current spec range was improved from 8-13 uA to just 9.8-10.1 uA, which is by 16.7 times. Line sensitivity range improved from 0.06-0.16 to just 0.01. Other specifications were also improved, with the Power Supply Rejection Ratio from −68 dB down to −91 dB (lower is better) and power consumption from the worst case of 140.2 mW to 55 mW.

FIGS. 32 and 33 show the values of $I_{ref}$ before and after self-adaptation for two sets of V and T conditions at the typical TT process corner. In both cases, the self-adaptation brought the $I_{ref}$ current from 30% and 20% away back to within 1 and 2% of the target value.

ADDITIONAL ASPECTS OF THE INVENTION

Additional aspects of the invention include the following:

In an aspect, a computer implemented method of designing a control circuit for controlling a self-adapting integrated circuit block, comprising:
simulating behavior of the self-adapting integrated circuit block over a range of input variables including at least one of: a process monitor input signal indicative of active device performance as a result of fabrication process variations; a voltage sensor signal indicative of the supply voltage; a temperature sensor signal indicative of the operating temperature; and, a changed performance specification;
deriving from simulation data an artificial intelligence or machine learning model representing behavior of the self-adapting integrated circuit block over a range of such variables and digital self-adaptation control signals;
calculating from the artificial intelligence or machine learning model the desired self-adaptation results;
capturing as design information the trained artificial intelligence or machine learning model; and storing the design information in a design database.

In another aspect, a computer implemented method of designing an integrated circuit comprising a plurality of self-adapting integrated circuit block, the method comprising:
selecting from a design library a plurality of self-adapting integrated circuit blocks, the design library comprising design information for each of the plurality of self-adapting integrated circuit blocks comprising a trained artificial intelligence or machine learning model representing behavior of the self-adapting integrated circuit block over a range of input variables and digital self-adaptation control signals; and
using a design tool and the design information, the design tool specifying a combined control circuit for controlling the plurality of self-adapting integrated circuit blocks.

In another aspect, a computer implemented method of designing a self-adapting circuit block, comprising: specifying as part of the self-adapting circuit block: a process monitor circuit, a functional section and an adaptation section;
simulating behavior of the functional section and adaptation section;
deriving an artificial intelligence or machine learning model of behavior of the functional section as a function of input variables; and
deriving from the artificial intelligence or machine learning model adaptation control signals to affect circuit components in response to the changed input variables.

In some embodiments, the method comprising:
testing performance of the self-adapting circuit block in accordance with the adaptation control signals;
if performance requires improvement, further changing the adaptation control signals; and
if performance does not require improvement, storing design information for the self-adapting circuit block in a design database.

In some embodiments, a self-adapting circuit block produced by the above method.

In some embodiments, a self-adapting circuit block design produced by the above method and stored on a non-transitory computer-readable medium.

In another aspect, a computer implemented method of designing a self-adapting integrated circuit, comprising:
selecting from a design library a selected plurality of self-adapting circuit blocks, the design library comprising design information for each of the plurality of self-adapting integrated circuit blocks comprising a model relating circuit behavior to input variables and digital self-adaptation control signals;
laying out the selected plurality of self-adapting circuit blocks as part of a design of the self-adapting integrated circuit;
using a design tool and the design information, the design tool specifying a combined control circuit for controlling the plurality of self-adapting integrated circuit blocks; and
laying out the combined control circuit as part of the design.

In some embodiments, the model is a trained artificial intelligence or machine learning model.

In another aspect, a self-adapting integrated circuit having an overall area, comprising:
a plurality of self-adapting circuit blocks each comprising a functional section and an adaptation section, each of the adaptation sections being configured to receive a plurality of digital control signals and to, in response to the plurality of digital control signals, adapt operation of the functional section such that at least one of: a) an output signal of the self-adapting integrated circuit block adheres more closely to a behavior of the output signal specified during design of the self-adapting integrated circuit block; and b) the output signal of the self-adapting integrated circuit block adheres more closely to a desired behavior determined after design of the self-adapting integrated circuit block;

In some embodiments, the self-adapting integrated circuit, comprising a control circuit implementing a trained artificial intelligence or machine learning model modeling behavior of the plurality of self-adapting integrated circuit blocks over a range of said input signals comprising at least one of: a process monitor input signal indicative of active device performance as a result of fabrication process variations; input voltage; temperature; and, a changed performance specification;
wherein the control signal outputs to the self-adapting circuit sections digital output signals determined in accordance with the trained artificial intelligence or machine learning model, in response to the input signals.

In another aspect, a method of operation of a self-adapting integrated circuit having an overall area and comprising a plurality of self-adapting circuit blocks each comprising a functional circuit section and adaptation section, the method comprising:

each of the adaptation circuit sections receiving a plurality of digital control signals and, in response to the plurality of digital control signals, adapting operation of the functional circuit section such that at least one of: a) an output signal of the self-adapting integrated circuit block adheres more closely to a behavior of the output signal specified during design of the self-adapting integrated circuit block; and b) the output signal of the self-adapting integrated circuit block adheres more closely to a desired behavior determined after design of the self-adapting integrated circuit block.

In some embodiments, the above method comprising:

a control circuit receiving input signals, including at least one of: a signal from process monitor indicative of active device performance as a result of fabrication process; signal from voltage sensor; signal from temperature sensor; and, a changed performance specification; and the control circuit, in response to the input signals, outputting a plurality of digital output signals to be applied to the self-adapting integrated circuit blocks;

wherein a relationship between the input signals and the digital output signals is determined in accordance with a trained artificial intelligence or machine learning model modeling behavior of the self-adapting integrated circuit blocks over a range of input signals, the control circuit implementing the trained artificial intelligence or machine learning model.

It will be appreciated by those skilled in the art that the present invention may be embodied in other specific forms without departing from the spirit or essential character thereof. The foregoing description is therefore intended in all respects to be illustrative, not restrictive. The scope of the invention is indicated by the appended claims, not the foregoing description, and all changes that come within the scope and range of equivalents thereof are intended to be embraced therein.

What is claimed:

1. An on-the-fly self-tuning analog microelectronic circuit for unpredictable variations in device fabrication process (P), operating voltage (V), and operating temperature (T), comprising:

a plurality of sensors configured to simultaneously measure signals related to a collocated analog circuit device that are indicative of all of: its performance given manufacturing variances or defects, given a deviation in its peculiar fabrication process (P), an on-the-fly operating supply voltage (V) applied to the particular device; and an on-the-fly operating temperature (T) of the particular analog circuit device;

a machine learning (ML) model trained in simulations, tested in simulations, and embedded in fabrication with the collocated analog circuit device;

wherein, the collocated analog circuit device is comprised of electronic components each with adjustable characteristics and each connected to be manipulated by the ML model;

wherein, the ML model receives PVT signals from the plurality of sensors and negates adverse effects of on-the-fly PVT variances as trained and tested in circuit simulations.

2. A method of self-adaptive control of an analog microelectronic circuit for unpredictable on-the-fly variations in all of device fabrication process (P), operating voltage (V), and operating temperature (T), comprising:

training in circuit simulations, testing in circuit simulations, and embedding in fabrication a ML model connected to manipulate electronic characteristics of a plurality of components within an associated analog microelectronic circuit device in response to unpredictable on-the-fly variations in each and all of PVT;

on-the-fly and after the associated analog microelectronic circuit device is fabricated, receiving with the ML model a sensing from a process monitor an input signal (P) indicative of a particular collocated analog circuit device performance as a result of deviances that fixed in due to its peculiar fabrication process;

on-the-fly and after the associated analog microelectronic circuit device is fabricated, receiving with the ML model a voltage sensor input signal (V) indicative of a supply voltage then being applied to the particular collocated analog circuit device;

on-the-fly and after the associated analog microelectronic circuit device is fabricated, receiving with the ML model a temperature sensor input signal (T) indicative of an operating temperature; and wherein, a layout and a device are produced for the ML model and analog microelectronic circuit.

* * * * *